(12) United States Patent
Masuoka et al.

(10) Patent No.: US 8,212,298 B2
(45) Date of Patent: Jul. 3, 2012

(54) SEMICONDUCTOR STORAGE DEVICE AND METHODS OF PRODUCING IT

(75) Inventors: Fujio Masuoka, Chuo-ku (JP); Shintaro Arai, Chuo-ku (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 268 days.

(21) Appl. No.: 12/704,239

(22) Filed: Feb. 11, 2010

(65) Prior Publication Data

US 2010/0213525 A1 Aug. 26, 2010

Related U.S. Application Data

(63) Continuation of application No. PCT/JP2009/051463, filed on Jan. 29, 2009.

(60) Provisional application No. 61/207,652, filed on Feb. 13, 2009.

(30) Foreign Application Priority Data

Jan. 29, 2008 (WO) .................. PCT/JP2008/051304

(51) Int. Cl.
*H01L 27/108* (2006.01)

(52) U.S. Cl. ......... 257/300; 257/E27.086; 257/E27.087; 257/302; 438/244

(58) Field of Classification Search .................. 257/190, 257/300, 305, 329, 330, E21.411, E27.086, 257/E27.087; 438/244, 700
See application file for complete search history.

(56) References Cited

U.S. PATENT DOCUMENTS 5,627,390 A 5/1997 Maeda et al.
5,780,888 A 7/1998 Maeda et al.
6,121,086 A * 9/2000 Kuroda et al. ............ 438/256
6,461,900 B1 10/2002 Sundaresan et al.
7,413,480 B2 * 8/2008 Thomas ..................... 439/700
2001/0052614 A1 12/2001 Ishibashi (Continued)

FOREIGN PATENT DOCUMENTS

DE 4443968 A1 11/1995

(Continued)

OTHER PUBLICATIONS

International Search Report for International Application No. PCT/JP2008/051304, dated Apr. 15, 2008, 2 pages.

(Continued)

*Primary Examiner* — Kenneth Parker
*Assistant Examiner* — Paul Budd
(74) *Attorney, Agent, or Firm* — Brinks Hofer Gilson & Lione

(57) ABSTRACT

A semiconductor storage device where one MOS transistor in a memory cell section includes a selection transistor, and one MOS transistor in a peripheral circuit section includes a first MOS transistor and a second MOS transistor of different conductivity type, the first MOS and second MOS transistors and the selection transistor include lower drain or source regions in a planar semiconductor layer, a pillar-shaped semiconductor layer on the planar semiconductor layer, upper source or drain regions in an upper portion of the pillar-shaped semiconductor layer, and a gate electrode that surrounds a sidewall of the pillar-shaped semiconductor layer through a dielectric film, and where a first silicide layer connects a surface of the lower drain or source region of the first MOS and second MOS transistors, and a second silicide layer on a surface of the lower drain or source region of the selection transistor.

12 Claims, 32 Drawing Sheets

U.S. PATENT DOCUMENTS

2002/0000624 A1 1/2002 Takemura et al.
2007/0075359 A1* 4/2007 Yoon et al. .................... 257/329

FOREIGN PATENT DOCUMENTS

| | | |
|---|---|---|
| JP | 02-188966 A | 7/1990 |
| JP | 07-321228 A | 12/1995 |
| JP | 09-008295 A | 1/1997 |
| JP | 11-087649 A | 3/1999 |
| JP | 2000-243085 A | 9/2000 |
| JP | 2002-009257 A | 1/2002 |
| JP | 2003-179160 A | 6/2003 |
| KR | 10-0132560 B1 | 12/1997 |
| KR | 10-0200222 B1 | 6/1999 |

OTHER PUBLICATIONS

International Search Report for International Application No. PCT/JP2009/051463, dated Feb. 24, 2009, 2 pages.

Office Action from counterpart Korean Application No. 10-2010-7018204, dated Mar. 29, 2012, 7 pages.

Non-Certified Partial Translation of Office Action from counterpart Korean Application No. 10-2010-7018204, dated Mar. 29, 2012, 1 page.

* cited by examiner (a)

(c)

(b)

(d)

(c)

(a)

(b)

(d)

(a)

(c)

(b)

(d)

(a)

(c)

(b)

(d)

(a)

(b)

(a)

(b)

(a)

(b)

(a)

(b)

(c)

(d)

SEMICONDUCTOR STORAGE DEVICE AND METHODS OF PRODUCING IT

RELATED APPLICATIONS

Pursuant to 35 U.S.C. §119(e), this application claims the benefit of the filing date of Provisional U.S. Patent Application Ser. No. 61/207,652 filed on Feb. 13, 2009. This application is a continuation application of PCT/JP2009/051463 filed on Jan. 29, 2009 which claims priority under 35 U.S.C. §365(a) to PCT/JP2008/051304 filed on Jan. 29, 2008. The entire contents of these applications are hereby incorporated by reference.

TECHNICAL FIELD

The present invention relates to a semiconductor device and a production method therefor, and more particularly to a semiconductor storage device such as a DRAM, a memory-embedded semiconductor device having embedded therein a logic circuit section and a memory section such as a DRAM, and methods of producing it.

BACKGROUND ART

With a view to achieving higher integration and higher performance of an LSI device, an SGT (Surrounding Gate Transistor) has been proposed which comprises a pillar-shaped semiconductor layer formed on a surface of a semiconductor substrate, and a gate formed to surround a sidewall of the pillar-shaped semiconductor layer (see the following Patent Document 1). In the SGT, a drain, a gate and a source are arranged in a vertical direction, so that an occupied area can be significantly reduced as compared with a conventional planar transistor.

In cases where a DRAM is formed using an SGT, a memory cell array can be configured as a cross point type, so that a cell size of $4F^2$ can be achieved, in theory. Thus, it is possible to drastically reduce a cell size, as compared with a conventional planar transistor-based DRAM having a cell size of $6F^2$ or $8F^2$. Therefore, a SGT-based DRAM (hereinafter referred to as "SGT-DRAM") has great potential as a DRAM requiring higher integration as a top priority, and an embedded memory for a CPU requiring an increase in capacity of a memory for caching, etc. However, in actual development toward practical use of an SGT-DRAM, a transistor structure in a peripheral circuit section and a logic circuit section to be embedded is critically important as well as a DRAM cell structure. In such a transistor, there is an extremely strong need for higher transistor performance as well as a reduction in occupied area. The following Non-Patent Document 1 is cited as a conventional example which mentions an SGT-DRAM, including a structure of a peripheral circuit section. This conventional example will be described below.

FIG. 34(a) is a top plan view of a DRAM cell array disclosed in the Non-Patent Document 1, and FIG. 34(b) is a sectional view taken along the cutting-plane line A-A' in the top plan view of FIG. 34(a).

Referring to the top plan view of FIG. 34(a), a plurality of pillar-shaped silicon layers 704 are formed on respective ones of a plurality of intersecting points of a plurality of bit lines 702 formed on a buried oxide film layer 701 with a plurality of word lines 703 formed above the buried oxide film layer 701, and a plurality of selection transistors are formed based on the respective pillar-shaped silicon layers 704. Further, a capacitor element is formed on a top of each of the selection transistors. A plurality of memory cells are formed at respective ones of all the intersecting points of the bit lines with the word lines, to make up a cross-point type cell array.

Referring to the sectional view of FIG. 34(b), each of the bit lines is formed by an $N^+$ diffusion layer 702 on the buried oxide film layer 701, and each of the word lines is formed by a polysilicon line. Each of the pillar-shaped silicon layers 704 is formed through a process of forming a gate dielectric film and a silicon film inside each of a plurality of contact holes formed in the word lines from thereabove, to make up the selection transistor. The capacitor element on the top of each of the selection transistors is formed by a lower electrode 705, a capacitor dielectric film 706 and an upper electrode 707, in the same manner as that in a conventional stacked-capacitor DRAM.

FIG. 35 is a sectional view showing a CMOS inverter disclosed in the following Non-Patent Document 1, as one example of a peripheral circuit. Referring to the sectional view of FIG. 35, an $N^+$ source diffusion layer 802a and a $P^+$ source diffusion layer 802b are formed on a buried oxide film 801, and a pillar-shaped silicon layer 804a forming an NMOS (NMOS-forming pillar-shaped silicon layer 804a) and a pillar-shaped silicon layer 804b forming a PMOS (PMOS-forming pillar-shaped silicon layer 804b) are formed on the $N^+$ source diffusion layer 802a and the $P^+$ source diffusion layer 802b, respectively. Further, an $N^+$ drain diffusion layer 805a is formed on a top of the NMOS-forming pillar-shaped silicon layer 804a, and a $P^+$ drain diffusion layer 805b is formed on a top of the PMOS-forming pillar-shaped silicon layer 804b. A gate 803 is formed around the respective pillar-shaped silicon layers. The $N^+$ source diffusion layer 802a is connected to a ground potential via a contact extending from a line layer 808a, and the $P^+$ source diffusion layer 802b is connected to a power supply potential via a contact extending from a line layer 808b. Further, the diffusion layer (805a, 805b) on each of the tops of the NMOS and PMOS-forming pillar-shaped silicon layers is connected to an output potential via a contact extending from a line layer 808c.

In this conventional example, an SOI (silicon-on-insulator) substrate is used to eliminate a need for forming a well, so that the source diffusion layers 802a, 802b can be isolated from each other simply by forming therebetween an element isolation region with a desired width through etching. This makes it possible to reduce a circuit area.

A production method for the CMOS inverter in the above conventional example will further be described based on sectional views of a DRAM cell section. Referring to FIG. 36(a), a silicon layer on a buried oxide film 701 is patterned to form a plurality of bit lines 702. Subsequently, a dielectric film and a polysilicon film are formed. Subsequently, the polysilicon film is patterned to form a plurality of word lines 703 and others. Referring to FIG. 36(b), a dielectric film is further formed, and a plurality of contact holes 708 are formed to penetrate through the polysilicon film and reach the silicon layer. Referring to FIG. 36(c), a surface of the polysilicon film defining each of the contact holes 708 is oxidized to form a gate oxide film, and an amorphous silicon film is formed to fill the respective contact holes 708. Subsequently, an upper diffusion layer 705 is formed in an upper portion of the amorphous silicon film by ion implantation. Referring to FIG. 36(d), the upper diffusion layer 705 is patterned and then a capacitor dielectric film 706 and an upper electrode 707 are formed to form a capacitor element.

Patent Document 1: JP 2-188966A
Non-Patent Document 1: S. Maeda, et al., "Impact of a Vertical Φ-Shape Transistor Cell for 1 Gbit DRAM and Beyond", IEEE TRANSACTIONS ON ELECTRON DEVICES, December 1995, VOL. 42, NO. 12, pp. 2117-2124

However, the structure of the peripheral circuit section in the above conventional example has the following problems.

Firstly, in view of high-performance requirements for a transistor in a peripheral circuit section of a DRAM and a logic circuit section of a DRAM-embedded device, it is contemplated to subject a source/drain diffusion layer to silicidation in order to reduce a parasitic resistance. However, in the above conventional example, a silicide layer must be formed in the source diffusion layer before forming a transistor. Generally, a silicide layer is low in thermal resistance. Thus, if a silicide layer is formed in the source diffusion layer and then a heat treatment required for forming a transistor is performed at about 1000° C., a resistivity of the silicide layer will become higher. Therefore, in the above conventional example, it is difficult to form in the source diffusion layer a silicide layer which contributes to a reduction in parasitic resistance.

Secondly, in the above conventional production method, the transistor-forming pillar-shaped silicon layer is made of polysilicon. This causes a significant deterioration in transistor performance, as compared with a conventional transistor where a channel region is made of single-crystal silicon.

As will be appreciated from the above description, the transistor structure of the peripheral circuit section disclosed in the Non-Patent Document 1 has significant difficultly in meeting the high-performance requirements for a transistor in a peripheral circuit section of a DRAM and a logic circuit section of a memory-embedded device.

SUMMARY OF THE INVENTION

In view of the above circumstances, it is an object of the present invention to achieve a high-performance transistor in a peripheral circuit section of an SGT-DRAM having a memory cell area of $4F^2$ and a logic circuit section of a memory-embedded device, and achieve a transistor structure allowing for design of a circuit with a small occupied area.

In accordance with a first aspect of the present invention, there is provided a semiconductor storage device having a memory cell section and a peripheral circuit section each formed using one or more MOS transistors, comprising: a substrate; a dielectric film on the substrate; and a planar semiconductor layer formed on the on-substrate dielectric layer, wherein: the at least one MOS transistor in the memory cell section comprises a selection transistor, the at least one MOS transistor in the peripheral circuit section comprises a first MOS transistor and a second MOS transistor which are different in conductivity type from each other, the first MOS transistor includes a first lower drain or source region formed in the planar semiconductor layer, a first pillar-shaped semiconductor layer formed on the planar semiconductor layer, a first upper source or drain region formed in an upper portion of the first pillar-shaped semiconductor layer, and a first gate electrode formed such that the first gate electrode surrounds a sidewall of the first pillar-shaped semiconductor layer through a first dielectric film, the second MOS transistor includes a second lower drain or source region formed in the planar semiconductor layer, a second pillar-shaped semiconductor layer formed on the planar semiconductor layer, a second upper source or drain region formed in an upper portion of the second pillar-shaped semiconductor layer, and a second gate electrode formed such that the second gate electrode surrounds a sidewall of the second pillar-shaped semiconductor layer through a second dielectric film; and the selection transistor includes a third lower drain or source region formed in the planar semiconductor layer, a third pillar-shaped semiconductor layer formed on the planar semiconductor layer, a third lower source or drain region formed in an upper portion of the third pillar-shaped semiconductor layer, and a third gate electrode formed such that the third gate electrode surrounds a sidewall of the third pillar-shaped semiconductor layer through a third dielectric film, and wherein the semiconductor storage device has a first silicide layer formed thereon to connect at least a part of a surface of the first lower drain or source region of the first MOS transistor and at least a part of a surface of the second lower drain or source region of the second MOS transistor, and a second silicide layer formed on at least a part of a surface of the third lower drain or source region of the selection transistor.

For example, the first silicide layer is formed in an area other than an area in which a contact for at least the first lower drain or source region and the second lower drain or source region is formed.

For example, the semiconductor storage device further comprises a gate line extending from the third gate electrode, wherein a memory cell of the memory cell section is a crosspoint type DRAM cell, wherein the third lower drain or source region forms at least a bit line and the third gate electrode and the gate line extending from the third gate electrode forms at least a word line.

For example, the semiconductor storage device further comprises a first contact formed on a top surface of the third upper source or drain region of the selection transistor, wherein the capacitor element is formed on a top surface of the first contact; a second contact formed on a top surface of the first or second upper source or drain region of the at least one MOS transistor in the peripheral circuit section; and a third contact formed on a top surface of the second contact, wherein the first contact is formed to have a top surface located at a same height position as that of the top surface of the second contact.

In accordance with a second aspect of the present invention, there is provided a semiconductor storage device having a memory cell section and a peripheral circuit section each formed using one or more MOS transistors, comprising: a substrate; a dielectric film on the substrate; and a planar semiconductor layer formed on the on-substrate dielectric layer, wherein: the peripheral circuit section comprises one or more peripheral circuit sections; and the memory cell section comprises a first memory cell section and a second memory cell section which are arranged on opposite sides of one of the peripheral circuit sections, wherein: the first and second memory cell sections are configured such that a plurality of first bit lines from the first memory cell section and a plurality of second bit lines from the second memory cell section are alternately connected to the one peripheral circuit section, in such a manner that each of a plurality of pairs of the alternately connected first and second bit lines are connected to a respective one of a plurality of sense amplifiers provided in the one peripheral circuit section; and the at least one MOS transistor in the peripheral circuit section comprises a MOS transistor constituting the sense amplifiers, the MOS transistor constituting the sense amplifier comprising a combination of a first PMOS transistor and a first NMOS transistor, and a combination of a second PMOS transistor and a second NMOS transistor, wherein: the fourth PMOS transistor includes a fourth P-type lower drain or source region formed in the planar semiconductor layer, a fourth pillar-shaped semiconductor layer formed on the planar semiconductor layer, a fourth P-type upper source or drain region formed in an upper portion of the fourth pillar-shaped semiconductor layer, and a fourth gate electrode formed such that the fourth gate electrode surrounds a sidewall of the fourth pillar-shaped semiconductor layer through a fourth dielectric film; the fourth NMOS transistor includes a fourth N-type lower drain or source region formed in the planar semiconductor layer, a fourth pillar-shaped semiconductor layer formed on the planar semiconductor layer, a fourth N-type upper source or drain region formed in an upper portion of the fourth pillar-shaped semiconductor layer, and a fourth gate electrode formed such that the fourth gate electrode surrounds a sidewall of the fourth pillar-shaped semiconductor layer through a fourth dielectric film; the fifth PMOS transistor includes a fifth P-type lower drain or source region formed in the planar semiconductor layer, a fifth pillar-shaped semiconductor layer formed on the planar semiconductor layer, a fifth P-type upper source or drain region formed in an upper portion of the fifth pillar-shaped semiconductor layer, and a fifth gate electrode formed such that the fifth gate electrode surrounds a sidewall of the fifth pillar-shaped semiconductor layer through a fifth dielectric film; and the fifth NMOS transistor includes a fifth N-type lower drain or source region formed in the planar semiconductor layer, a fifth pillar-shaped semiconductor layer formed on the planar semiconductor layer, a fifth N-type upper source or drain region formed in an upper portion of the fifth pillar-shaped semiconductor layer, and a fifth gate electrode formed such that the fifth gate electrode surrounds a sidewall of the fifth pillar-shaped semiconductor layer through a fifth dielectric film, and wherein: the semiconductor storage device has a fourth silicide layer formed thereon to connect at least a part of a surface of the fourth P-type lower drain or source region of the fourth PMOS transistor and at least a part of a surface of the fourth N-type lower drain or source region of the fourth NMOS transistor, a fifth silicide layer formed thereon to connect at least a part of a surface of the fifth P-type lower drain or source region of the fifth PMOS transistor and at least a part of a surface of the fifth N-type lower drain or source region of the fifth NMOS transistor, the semiconductor storage device further comprising a fourth contact formed on the fourth silicide layer, a fifth contact formed on the fifth silicide layer, a sixth contact formed on a fourth gate line which connects respective gate electrodes of the fourth PMOS and NMOS transistors, and an seventh contact formed on a fifth gate line which connects respective gate electrodes of the fifth PMOS and NMOS transistors; the combination of fourth PMOS and NMOS transistors and the combination of fifth PMOS and NMOS transistors are arranged in adjacent relation to each other and between the first bit line formed as a second metal layer line and the second bit lines each formed as the second metal layer line, the first bit line being connected to the fourth silicide layer through the fourth contact and connected to the fifth gate line through the seventh contact, the second bit line being connected to the fifth silicide layer through the fifth contact and connected to the fourth gate line through the sixth contact; a power source potential line formed as a first metal layer line and perpendicular to the bit line is connected to an eighth and ninth contacts which are formed on the fourth P-type upper source or drain region of the fourth PMOS transistor and the fifth P-type upper source or drain region of the fifth PMOS transistor respectively; and a ground potential line formed as the first metal layer line and perpendicular to the bit line is connected to an tenth and eleventh contacts which are formed on the fourth N-type upper source or drain region of the fourth NMOS transistor and the fifth N-type upper source or drain region of the fifth NMOS transistor respectively.

For example, the fourth silicide layer is formed in an area other than an area in which a contact for at least the fourth P-type lower drain or source region and the fourth N-type lower drain or source region is formed, or the fifth silicide layer is formed in an area other than an area in which a contact for at least the fifth P-type lower drain or source region and the fifth N-type lower drain or source region is formed.

In accordance with a third aspect of the present invention, there is provided a semiconductor storage device having a memory cell section and a peripheral circuit section each formed using one or more MOS transistors, comprising: a substrate; a dielectric film on the substrate; and a planar semiconductor layer formed on the on-substrate dielectric layer, wherein: the peripheral circuit section comprises one or more peripheral circuit sections; and the memory cell section comprises a third memory cell section and a fourth memory cell section which are arranged on opposite sides of one of the peripheral circuit sections, wherein: the third and fourth memory cell sections are configured such that a plurality of third bit lines from the third memory cell section and a plurality of fourth bit lines from the fourth memory cell section are alternately connected to the one peripheral circuit section, in such a manner that each of a plurality of pairs of the alternately connected third and fourth bit lines are connected to a respective one of a plurality of row selection switch circuits provided in the one peripheral circuit section; and the at least one MOS transistor in the peripheral circuit section comprises a MOS transistor constituting the row selection switch circuits, the MOS transistor constituting the row selection switch circuit comprising a combination of a sixth NMOS transistor and a seventh NMOS transistor, the sixth NMOS transistor includes a sixth N-type lower drain or source region formed in the planar semiconductor layer, a sixth P-type pillar-shaped semiconductor layer formed on the planar semiconductor layer, a sixth N-type upper source or drain region formed in an upper portion of the sixth pillar-shaped semiconductor layer, and a sixth gate electrode formed such that the sixth gate electrode surrounds a sidewall of the sixth pillar-shaped semiconductor layer through a sixth dielectric film, the seventh NMOS transistor includes a seventh N-type lower drain or source region formed in the planar semiconductor layer, a seventh P-type pillar-shaped semiconductor layer formed on the planar semiconductor layer, a seventh N-type upper source or drain region formed in an upper portion of the seventh pillar-shaped semiconductor layer, and a seventh gate electrode formed such that the seventh gate electrode surrounds a sidewall of the seventh pillar-shaped semiconductor layer through a seventh dielectric film, and wherein: the semiconductor storage device has a sixth silicide layer formed on at least a part of a surface of the sixth N-type lower drain or source region of the sixth NMOS transistor, a seventh silicide layer formed on at least a part of a surface of the seventh N-type lower drain or source region of the seventh NMOS transistor and a sixth gate line which connects the sixth gate electrode of the sixth NMOS transistor and the seventh gate electrode of the seventh NMOS transistor, the semiconductor storage device further comprising a twelfth contact formed on the sixth silicide layer, a thirteenth contact formed on the seventh silicide layer, a fourteenth contact formed on the sixth N-type upper source or drain region and connected to the third bit line, a fifteenth contact formed on the seventh N-type upper source or drain region and connected to the fourth bit line and a sixteenth contact formed on the sixth gate line and connected to a row selection line.

In accordance with a fourth aspect of the present invention, there is provided a semiconductor storage device having a memory cell section and a peripheral circuit section each formed using one or more MOS transistors, comprising: a substrate; a dielectric film on the substrate; and a planar semiconductor layer formed on the on-substrate dielectric layer, wherein: the peripheral circuit section comprises one or more peripheral circuit sections; and the memory cell section comprises a fifth memory cell section and a sixth memory cell section which are arranged on opposite sides of one of the peripheral circuit sections, wherein: the fifth and sixth memory cell sections are configured such that a plurality of fifth bit lines from the fifth memory cell section and a plurality of sixth bit lines from the sixth memory cell section are alternately connected to the one peripheral circuit section, in such a manner that each of a plurality of pairs of the alternately connected fifth and sixth bit lines are connected to a respective one of a plurality of pre-charge circuits provided in the one peripheral circuit section; and the at least one MOS transistor in the peripheral circuit section comprises a MOS transistor constituting the pre-charge circuits, the MOS transistor constituting the pre-charge circuit comprising a eighth NMOS transistor, a ninth NMOS transistor, and a tenth NMOS transistor, wherein: the eighth NMOS transistor includes a eighth N-type lower drain or source region formed in the planar semiconductor layer, a eight pillar-shaped semiconductor layer formed on the planar semiconductor layer, a eighth N-type upper source or drain region formed in an upper portion of the eighth pillar-shaped semiconductor layer, and a eighth gate electrode formed such that the eighth gate electrode surrounds a sidewall of the eighth pillar-shaped semiconductor layer through a eighth dielectric film, the ninth NMOS transistor includes a ninth N-type lower drain or source region formed in the planar semiconductor layer, a ninth pillar-shaped semiconductor layer formed on the planar semiconductor layer, a ninth N-type upper source or drain region formed in an upper portion of the ninth pillar-shaped semiconductor layer, and a ninth gate electrode formed such that the ninth gate electrode surrounds a sidewall of the ninth pillar-shaped semiconductor layer through a ninth dielectric film; and the tenth NMOS transistor includes a tenth N-type lower drain or source region formed in the planar semiconductor layer, a tenth pillar-shaped semiconductor layer formed on the planar semiconductor layer, a tenth N-type upper source or drain region formed in an upper portion of the tenth pillar-shaped semiconductor layer, and a tenth gate electrode formed such that the tenth gate electrode surrounds a sidewall of the tenth pillar-shaped semiconductor layer through a tenth dielectric film, and wherein: the semiconductor storage device has a eighth silicide layer formed on at least a part of a surface of the eighth N-type lower drain or source region of the eighth NMOS transistor, a ninth silicide layer formed on at least a part of a surface of the ninth N-type lower drain or source region of the ninth NMOS transistor and a eighth gate line which connects the respective gate electrodes of the eighth NMOS transistor, the ninth NMOS transistor and the tenth NMOS transistor, the semiconductor storage device further comprising a seventeenth contact formed on the eighth silicide layer and connected to the fifth bit line, a eighteenth contact formed on the ninth silicide layer and connected to the sixth bit line, and a nineteenth and twentieth contact formed on the eighth and ninth N-type upper source or drain region respectively both of which are connected to a ½ power supply voltage line, and a twenty-first contact formed on the eighth gate line and connected to the pre-charge signal line; and the ninth N-type lower drain or source region and the tenth N-type lower drain or source region are connected through the ninth silicide layer.

In accordance with a fifth aspect of the present invention, there is provided a semiconductor storage device having a memory cell section and a peripheral circuit section each formed using one or more MOS transistors, comprising: a substrate; a dielectric film on the substrate; and a planar semiconductor layer formed on the on-substrate dielectric layer, wherein: the peripheral circuit section comprises one or more peripheral circuit sections; and the memory cell section comprises a fifth memory cell section and a sixth memory cell section which are arranged on opposite sides of one of the peripheral circuit sections, wherein: the fifth and sixth memory cell sections are configured such that a plurality of fifth bit lines from the fifth memory cell section and a plurality of sixth bit lines from the sixth memory cell section are alternately connected to the one peripheral circuit section, in such a manner that each of a plurality of pairs of the alternately connected fifth and sixth bit lines are connected to a respective one of a plurality of pre-charge circuits provided in the one peripheral circuit section; and the at least one MOS transistor in the peripheral circuit section comprises a MOS transistor constituting the pre-charge circuits, the MOS transistor constituting the pre-charge circuit comprising a eighth NMOS transistor, a ninth NMOS transistor, and a tenth NMOS transistor, wherein: the eighth NMOS transistor includes a eighth N-type lower drain or source region formed in the planar semiconductor layer, a eighth pillar-shaped semiconductor layer formed on the planar semiconductor layer, a eighth N-type upper source or drain region formed in an upper portion of the eighth pillar-shaped semiconductor layer, and a eighth gate electrode formed such that the eighth gate electrode surrounds a sidewall of the eighth pillar-shaped semiconductor layer through a eighth dielectric film, the ninth NMOS transistor includes a ninth N-type lower drain or source region formed in the planar semiconductor layer, a ninth pillar-shaped semiconductor layer formed on the planar semiconductor layer, a ninth N-type upper source or drain region formed in an upper portion of the ninth pillar-shaped semiconductor layer, and a ninth gate electrode formed such that the ninth gate electrode surrounds a sidewall of the ninth pillar-shaped semiconductor layer through a ninth dielectric film; and the tenth NMOS transistor includes a tenth N-type lower drain or source region formed in the planar semiconductor layer, a tenth pillar-shaped semiconductor layer formed on the planar semiconductor layer, a tenth N-type upper source or drain region formed in an upper portion of the tenth pillar-shaped semiconductor layer, and a tenth gate electrode formed such that the tenth gate electrode surrounds a sidewall of the tenth pillar-shaped semiconductor layer through a tenth dielectric film, and wherein: the semiconductor storage device has a eighth silicide layer formed on at least a part of a surface of the eighth N-type lower drain or source region of the eighth NMOS transistor, a ninth silicide layer formed on at least a part of a surface of the ninth N-type lower drain or source region of the ninth NMOS transistor and a eighth gate line which connects the respective gate electrodes of the eighth NMOS transistor, the ninth NMOS transistor and the tenth NMOS transistor, the semiconductor storage device further comprising a seventeenth contact formed on the eighth silicide layer and connected to the fifth bit line, a eighteenth contact formed on the ninth silicide layer and connected to the sixth bit line, and a nineteenth and twentieth contact formed on the eighth and ninth N-type upper source or drain region respectively both of which are connected to a ½ power supply voltage line, and a twenty-first contact formed on the eighth gate line and connected to the pre-charge signal line; and the eighth N-type lower drain or source region and the tenth N-type lower drain or source region are connected through the eighth silicide layer, and/or the ninth N-type lower drain or source region and the tenth N-type lower drain or source region are connected through the ninth silicide layer.

In accordance with a sixth aspect of the present invention, there is provided a method of producing a semiconductor storage device which has a memory cell section and a peripheral circuit section each formed using one or more MOS transistors, comprising the steps of: forming a planar semiconductor layer on a dielectric film on a substrate, and a plurality of pillar-shaped semiconductor layers on the planar semiconductor layer; isolating the planar semiconductor layer as an element; forming a drain or source region in the planar semiconductor layer; thereafter forming a first dielectric film on at least a part of a surface of the resulting product; forming a conductive film on the first dielectric film; etching back the first dielectric film and the conductive film; selectively removing by etching the first dielectric film and the conductive film including a portion thereof corresponding to a portion in which the after-mentioned silicide layer is formed to form a gate electrode formed around each of the pillar-shaped semiconductor layers and a gate line extending from the gate electrode; forming a source or drain region in an upper portion of each of the plurality of pillar-shaped semiconductor layers to have a same conductivity type as that of the drain or source region; forming a silicide layer for connecting at least a part of a surface of the drain or source region of each of first MOS transistors and at least a part of a surface of the drain or source region of each of second MOS transistors, wherein each of the first and second MOS transistors is one of a plurality of MOS transistors corresponding to respective ones of the plurality of pillar-shaped semiconductor layers, the first and second MOS transistors are included in the peripheral circuit, and the second MOS transistor has a different conductive type from that of the first MOS transistor; forming a contact on a top surface of the source or drain region of each of the MOS transistors corresponding to the respective ones of the plurality of pillar-shaped semiconductor layers; forming a capacitor element on a top surface of the contact formed on the top surface of the source or drain region of each of third ones of the MOS transistors corresponding to the respective ones of the plurality of pillar-shaped semiconductor layers, wherein the third MOS transistors are included in the memory cell section; and forming an additional contact on a top surface of the contact formed on the top surface of the source or drain region of each of the first and second MOS transistors.

For example, forming the silicide layer further comprises forming a silicide layer on a surface of the source or drain region of each of the first and second MOS transistors.

In accordance with a seventh aspect of the present invention, there is provided a method of producing a semiconductor storage device which has a memory cell section and a peripheral circuit section each formed using one or more MOS transistors, comprising the steps of: forming a planar semiconductor layer on a dielectric film on a substrate, and a plurality of pillar-shaped semiconductor layers on the planar semiconductor layer; isolating the planar semiconductor layer as an element; forming a drain or source region in the planar semiconductor layer; thereafter forming a first dielectric film on at least a part of a surface of the resulting product; forming a conductive film on the first dielectric film; etching back the first dielectric film and the conductive film; selectively removing by etching the first dielectric film and the conductive film including a portion thereof corresponding to a part in which the after-mentioned silicide layer is formed to form a gate electrode formed around each of the pillar-shaped semiconductor layers and a gate line extending from the gate electrode; forming a source or drain region in an upper portion of each of the plurality of pillar-shaped semiconductor layers to have a same conductivity type as that of the drain or source region; thereafter forming a protective film on a surface of the resulting product; removing by etching the protective film only in the peripheral circuit section; forming a silicide layer for connecting at least a part of a surface of the drain or source region of each of first MOS transistors and at least a part of a surface of the drain or source region of each of second MOS transistors, wherein each of the first and second MOS transistors is one of a plurality of MOS transistors corresponding to respective ones of the plurality of pillar-shaped semiconductor layers, the first and second MOS transistors are included in the peripheral circuit, and the second MOS transistor has a different conductive type from that of the first MOS transistor; forming a contact on a top surface of the source or drain region of each of the MOS transistors corresponding to the respective ones of the plurality of pillar-shaped semiconductor layers; forming a capacitor element on a top surface of the contact formed on the top surface of the source or drain region of each of third ones of the MOS transistors corresponding to the respective ones of the plurality of pillar-shaped semiconductor layers, wherein the third MOS transistors are included in the memory cell section; and forming an additional contact on a top surface of the contact formed on the top surface of the source or drain region of each of the first and second MOS transistors.

For example, forming a silicide layer further comprises forming a silicide layer on a surface of the source or drain region of each of the first and second MOS transistors.

As described above, in the semiconductor storage device and the memory-embedded semiconductor device of the present invention, a MOS transistor constituting the memory cell section and the peripheral circuit section and the logic circuit section is formed as a vertical transistor which comprises a planar semiconductor layer formed on a dielectric film on a substrate, a first impurity region formed in the planar semiconductor layer, a plurality of pillar-shaped semiconductor layers formed on the planar semiconductor layer, a second impurity region formed in an upper portion of each of the pillar-shaped semiconductor layers, and a gate formed on a side wall of each of the pillar-shaped semiconductor layers. Further, in the peripheral circuit section and the logic circuit section, a silicide layer is formed in a surface of the planar semiconductor layer to allow an $N^+$ impurity region of an NMOS transistor and a $P^+$ impurity region of a PMOS transistor to be directly connected to each other therethrough. This makes it possible to achieve a circuit having a reduced occupied area.

DETAILED DESCRIPTION OF THE PREFERRED EMBODIMENTS

First Embodiment

Figure 1:
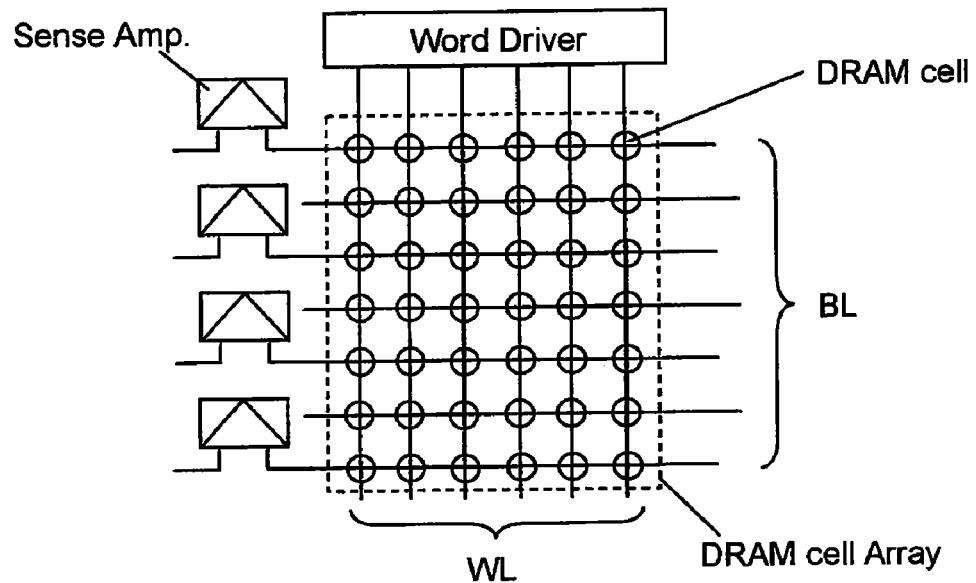
FIG. 1 is a diagram showing a configuration of a cell array of a DRAM according to a first embodiment of the present invention.
Figure 2:
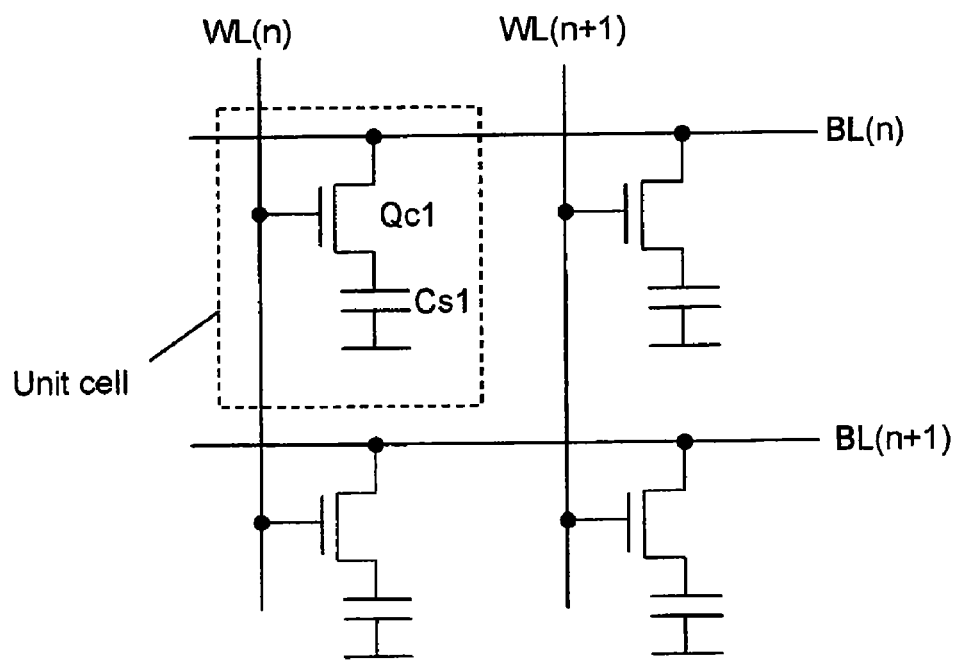
FIG. 2 is an equivalent circuit diagram of the DRAM cell array in the first embodiment.

FIG. 1 illustrates a configuration of a cell array of a DRAM according to a first embodiment of the present invention. A plurality of DRAM cells are formed at respective ones of all a plurality of intersecting points of a plurality of bit lines with a plurality of word lines, to make up a cross-point type cell array. FIG. 2 illustrates an equivalent circuit of the DRAM cell formed at each of the intersecting points of the bit lines with the word lines. The DRAM cell comprises one capacitor element Cs1 operable to accumulate electric charges, and a selection transistor Qc1 operable to transfer electric charges. As a result of accumulating electric charges in the capacitor element Cs1, data is stored therein. Then, when a word line WL(n) associated with a gate electrode of the selection transistor Qc1 is turned on, the data stored in the capacitor element Cs1 is read out onto a bit line BL(n). The read-out signal is amplified by a sense amplifier connected to the bit line.

Figure 3:
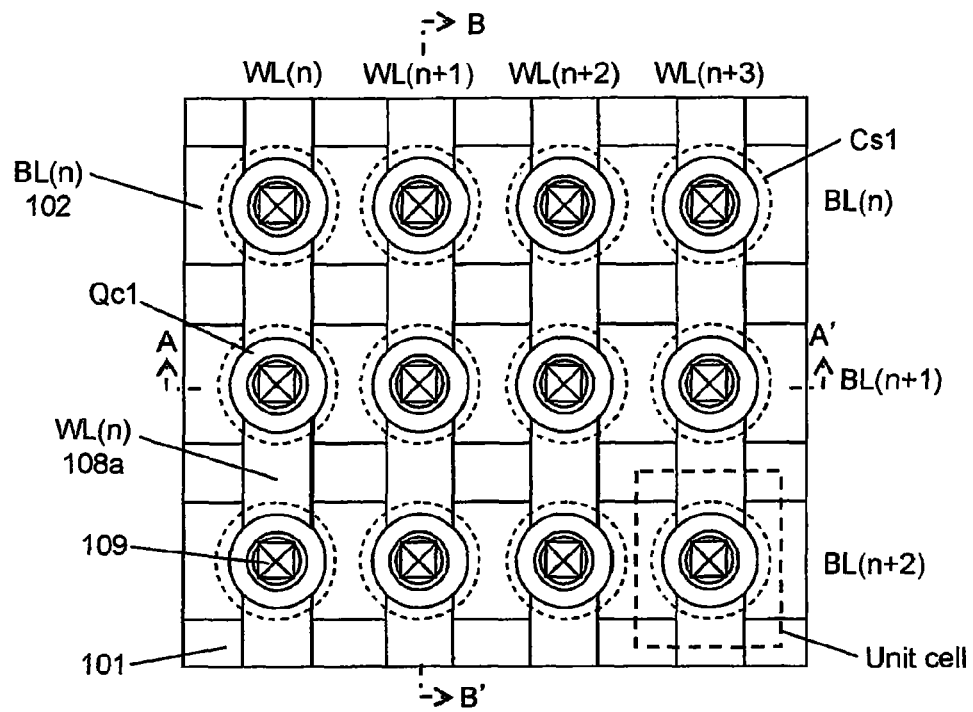
FIG. 3 is a top plan view showing the DRAM cell array in the first embodiment.
Figure 4:
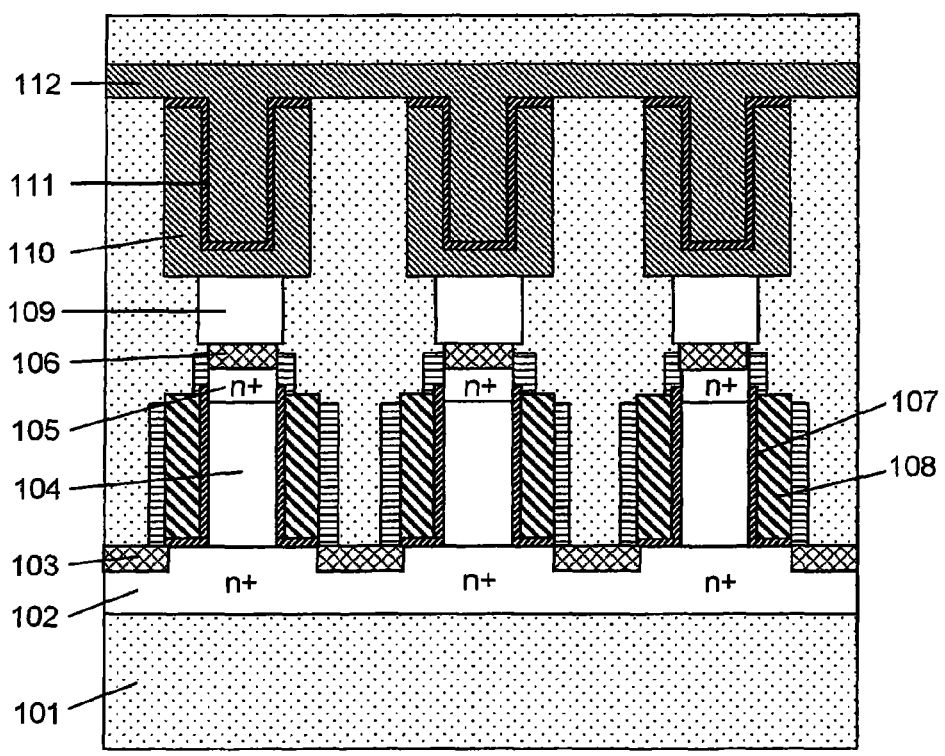
FIG. 4 is a sectional view showing the DRAM cell array in the first embodiment.

FIG. 3 is a top plan view showing the DRAM cell array. FIG. 4 is a sectional view taken along the cutting-plane line A-A' in FIG. 3, and FIG. 5 is a sectional view taken along the cutting-plane line B-B' in FIG. 3.

With reference to the top plan view of FIG. 3, a configuration of the DRAM cell array will be firstly described.

A plurality of lower diffusion layers 102 each having a silicided surface and serving as a bit line BL(n) are arranged on a buried oxide film 101 to extend in a lateral direction. A plurality of selection transistors Qc1 for allowing access to corresponding ones of the memory cells are formed on each of the lower diffusion layers 102. A plurality of gate electrodes 108 are formed to surround respective ones of a plurality of pillar-shaped silicon layers 104 each forming the selection transistor Qc1, and a gate line 108a is arranged to extend from the gate electrodes 108 in a longitudinal direction to serve as a word line WL(n). A contact 109 is formed on an upper diffusion layer 105 of each of the pillar-shaped silicon layers 104 forming the selection transistors Qc1 to allow each of the selection transistors Qc1 to be connected to a capacitor element Cs1 therethrough.

Figure 5:
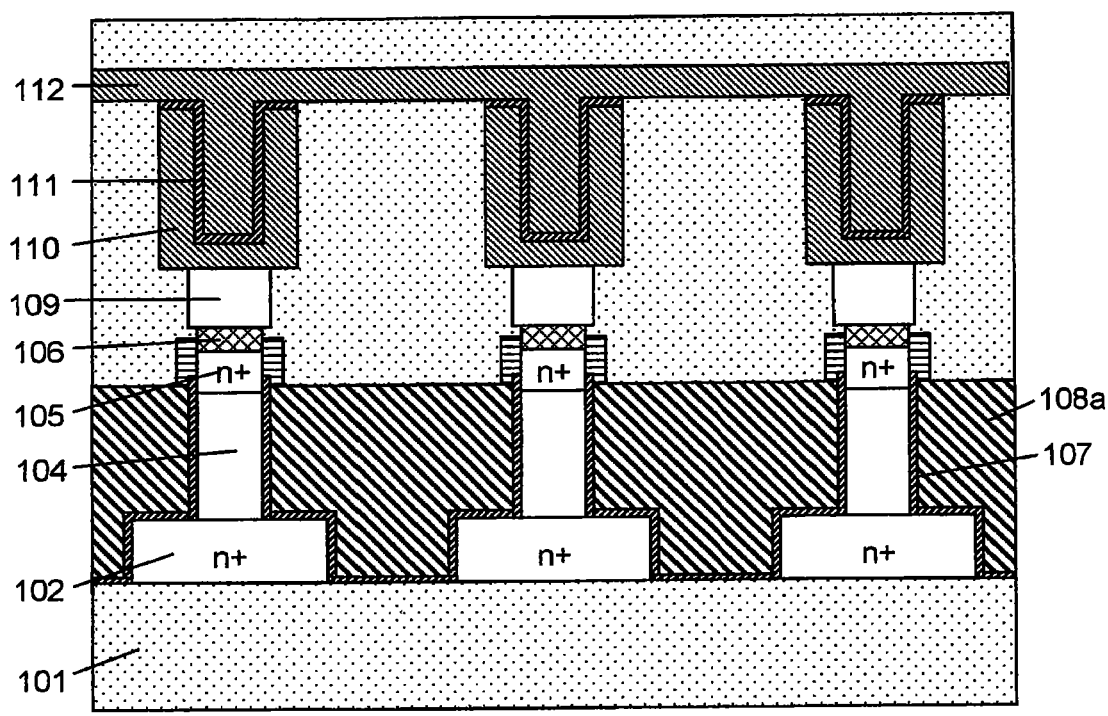
FIG. 5 is a sectional view showing the DRAM cell array in the first embodiment.

With reference to the sectional views of FIGS. 4 and 5, the configuration of the DRAM cell array will further be described.

The lower diffusion layer 102 on the buried oxide layer 101 comprises a silicon layer having a silicide layer 103 formed in a top surface thereof. The lower diffusion layer 102 serves as the bit line BL(n) which is shared by laterally aligned ones of the selection transistors Qc1 having a common sense amplifier, and connected to a peripheral circuit at an end of the cell array. The plurality of pillar-shaped silicon layers 104 are formed on the lower diffusion layer 102 comprising the silicon layer, and a gate dielectric film 107 and the gate electrode 108 are formed to surround each of the pillar-shaped silicon layers 104. The gate line 108a extending from the gate electrodes 108 serves as the word line WL(n) which is shared by longitudinally aligned ones of the selection transistors Qc1 having a common word driver circuit, and connected to a peripheral circuit at an end of the cell array. The upper diffusion layer 105 is formed in an upper portion of each of the pillar-shaped silicon layers, and a silicide layer 106 is formed in a top surface of the upper diffusion layer 105. The upper diffusion layer 105 is connected to the contact 109 which is connected to a lower electrode 110 of the capacitor element Cs1. The capacitor element Cs1 has an upper electrode 112 formed on the lower electrode 110 through a capacitor dielectric film 111.

As a means to reduce a chip area of a DRAM or a DRAM-embedded logic device, it is contemplated to reduce an occupied area of a CMOS circuit occupying a large part of a memory peripheral circuit or a logic circuit (hereinafter referred to as "CMOS circuit section").

Figure 6:
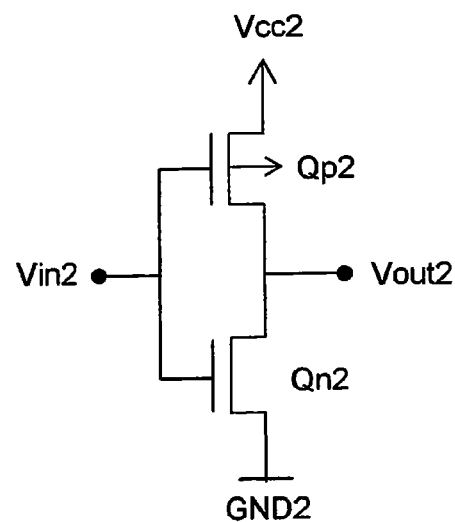
FIG. 6 is an equivalent circuit diagram of a CMOS inverter as one example of a peripheral circuit in the first embodiment.

The present invention can reduce an occupied area of a CMOS circuit section. One example of a technique of reducing an occupied area of a CMOS circuit section according to the first embodiment will be described below by taking a CMOS inverter as an example of the CMOS circuit section. FIG. 6 illustrates an equivalent circuit of a CMOS inverter according to the first embodiment, and FIG. 7 is a top plan view showing the CMOS inverter.

With reference to the top plan view of FIG. 7, a configuration of the CMOS inverter will be briefly described below. A lower diffusion layer is formed on a buried oxide film layer 201, and a silicide layer 203 is formed in a top surface of the lower diffusion layer. An NMOS transistor Qn 2 and a PMOS transistor Qp 2 are formed, respectively, on an N$^+$ diffusion region and a P$^+$ diffusion region of the lower diffusion layer. A contact (209a, 209b) formed on a gate line (208a, 208b) extending from a gate electrode (208) of each of the transistors is connected to an input line Vin 2, and a contact 209c formed on a silicide layer 203 on the top surface of the lower diffusion layer is connected to an output line Vout 2. Further, a contact 209d formed on an upper diffusion layer of a pillar-shaped silicon layer forming the NMOS transistor Qn 2 is connected to a ground potential line GND 2, and a contact 209e formed on an upper diffusion layer of a pillar-shaped silicon layer forming the PMOS transistor Qp 2 is connected to a power supply potential line Vcc 2. In this manner, the CMOS inverter is formed.

Figure 7:
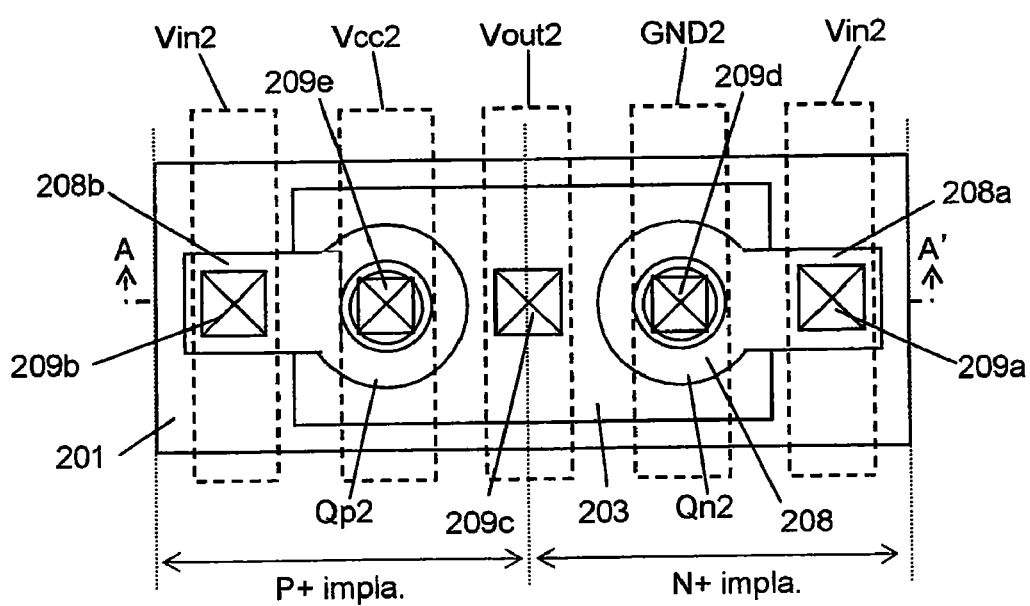
FIG. 7 is a top plan view of the CMOS inverter in the first embodiment.
Figure 8:
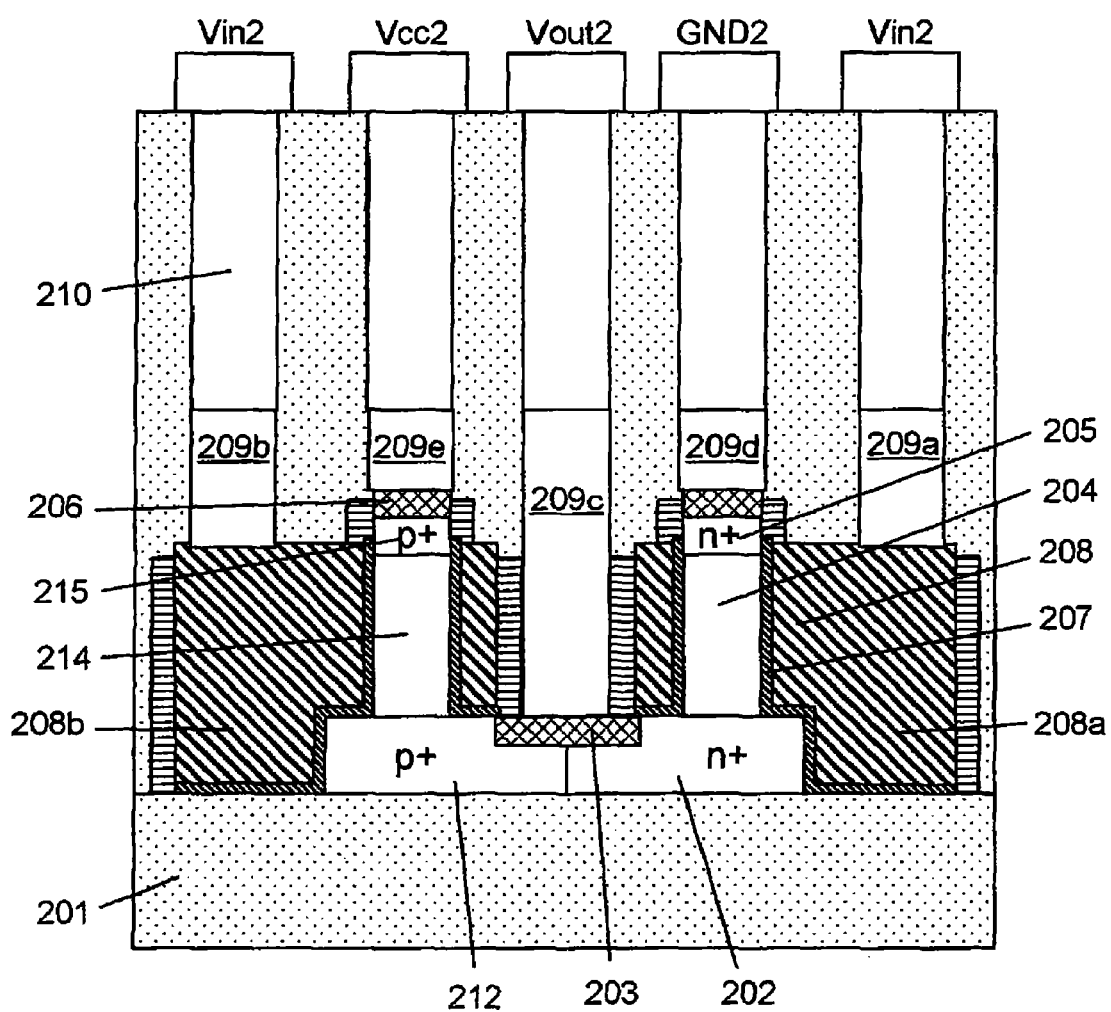
FIG. 8 is a sectional view of the CMOS inverter in the first embodiment.
Figure 9:
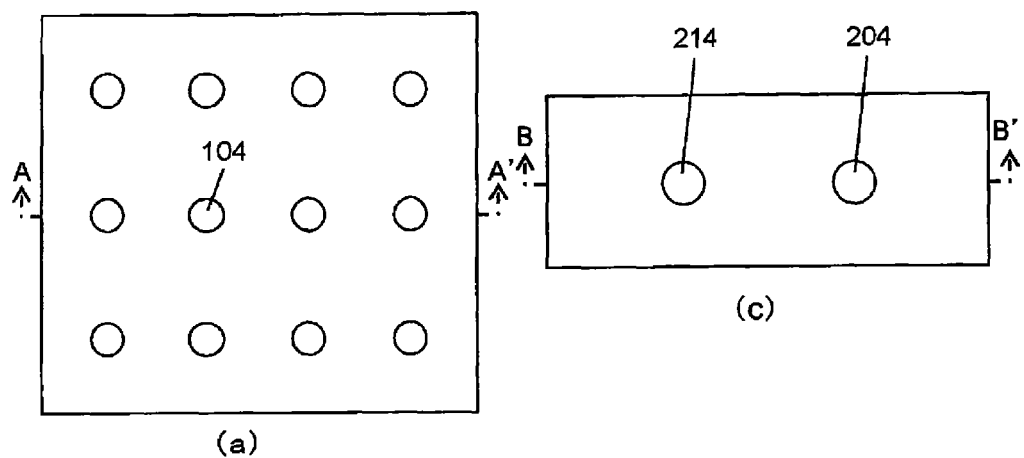
FIGS. 9(a) to 9(d) are process flow diagrams showing a production method for the DRAM according to the first embodiment, in order of process sequence.
Figure 9:
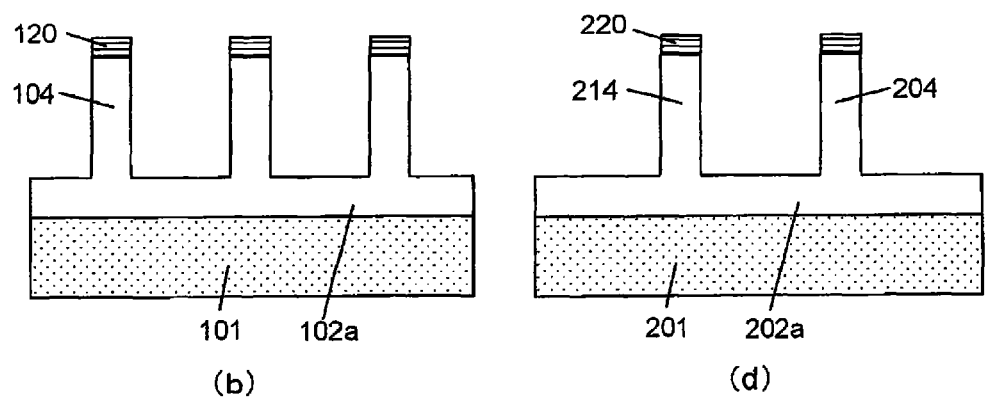
Figure 10:
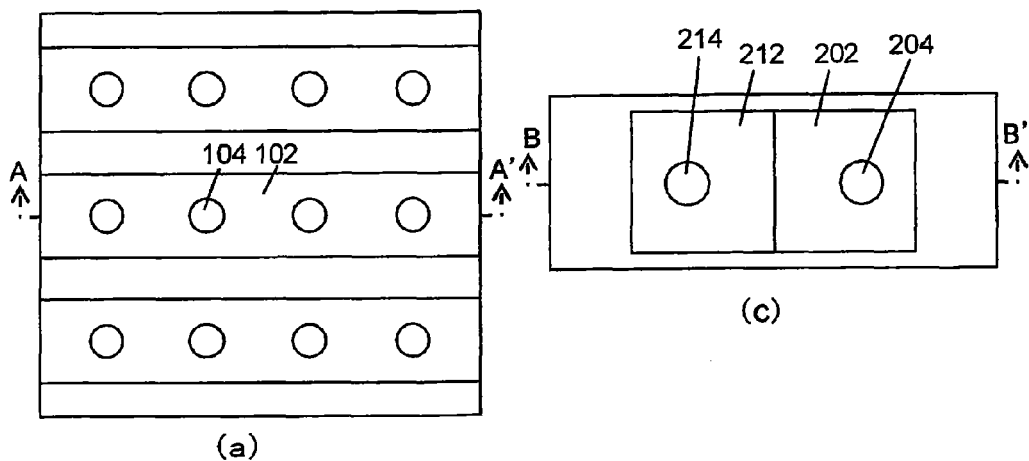
FIGS. 10(a) to 10(d) are process flow diagrams showing the production method in order of process sequence.
Figure 10:
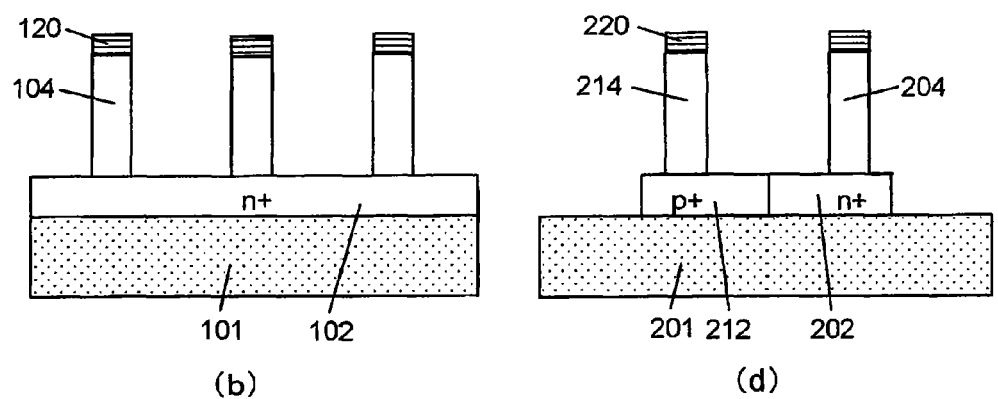
Figure 11:
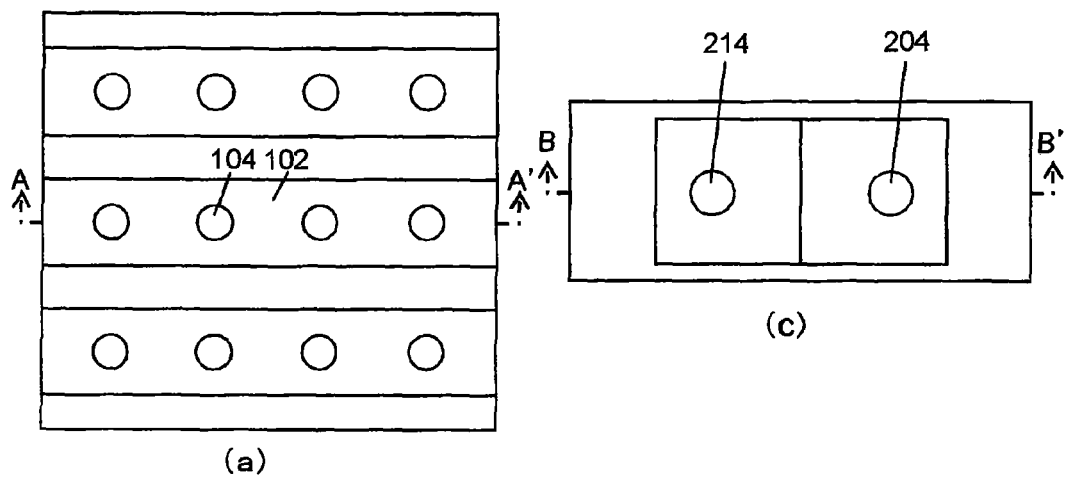
FIGS. 11(a) to 11(d) are process flow diagrams showing the production method in order of process sequence.
Figure 11:
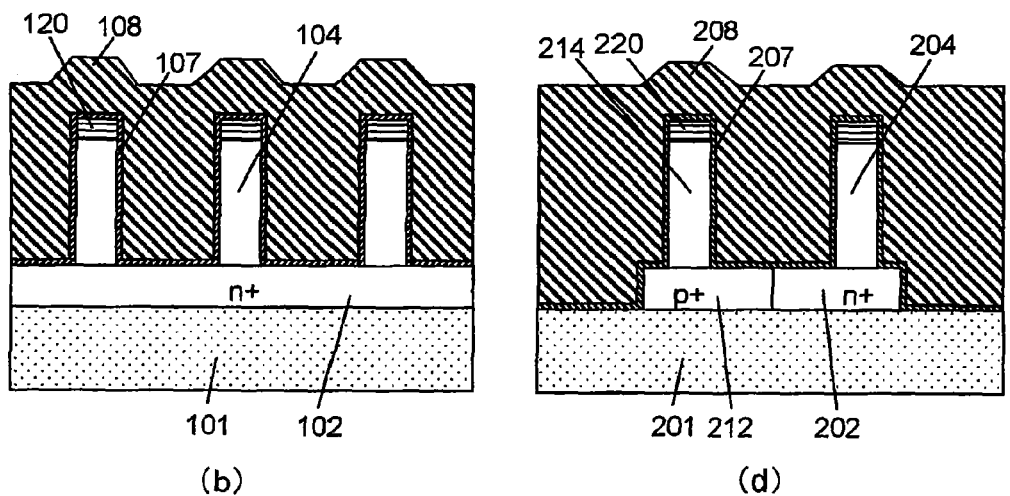
Figure 12:
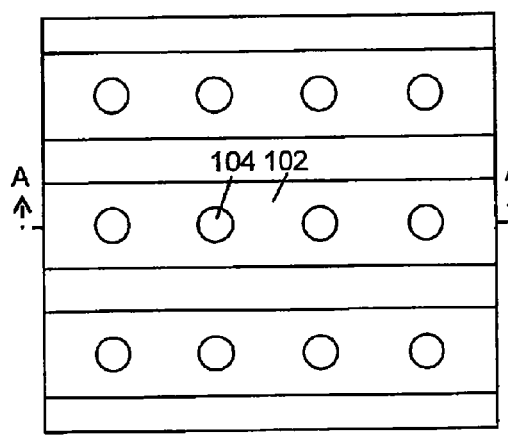
FIGS. 12(a) to 12(d) are process flow diagrams showing the production method in order of process sequence.
Figure 12:
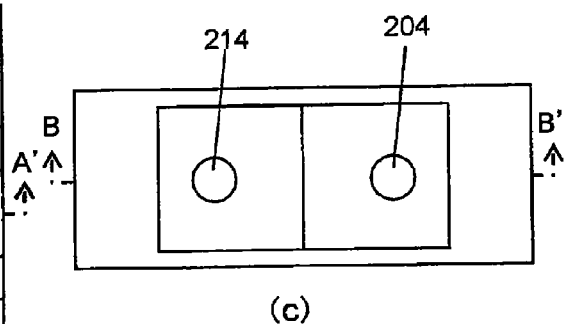
Figure 12:
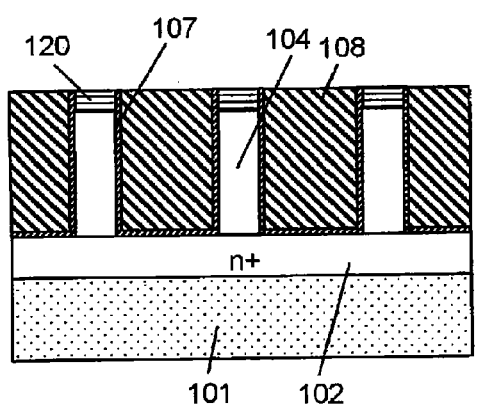
Figure 12:
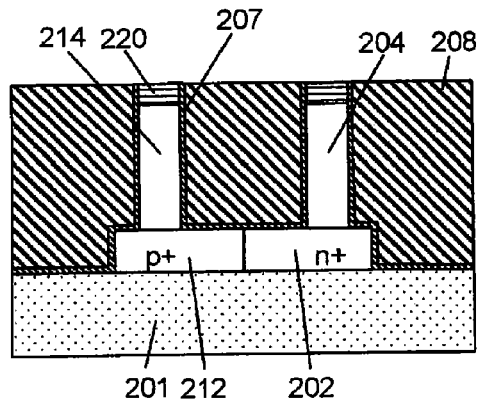
Figure 13:
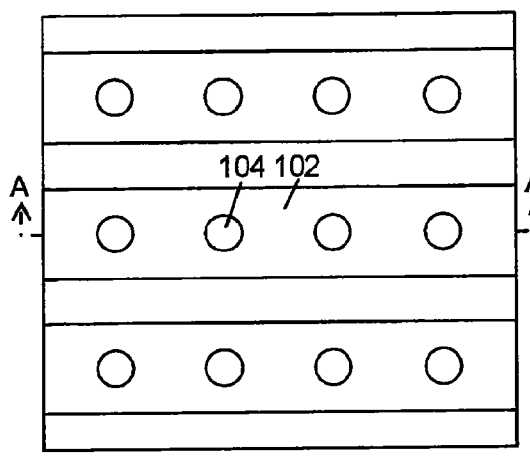
FIGS. 13(a) to 13(d) are process flow diagrams showing the production method in order of process sequence.
Figure 13:
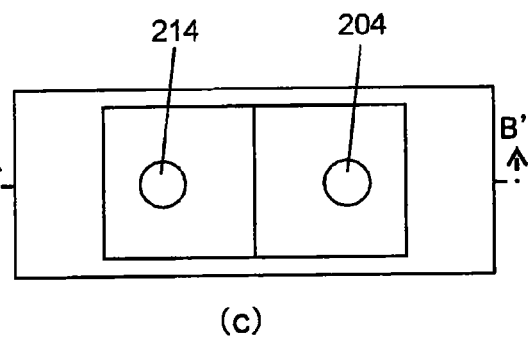
Figure 13:
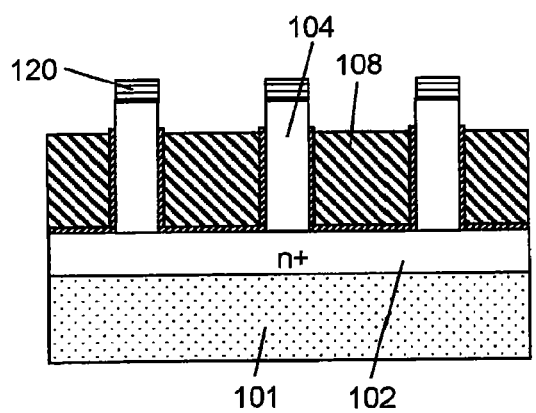
Figure 13:
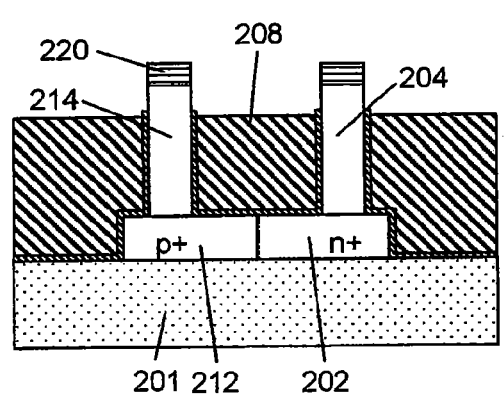
Figure 14:
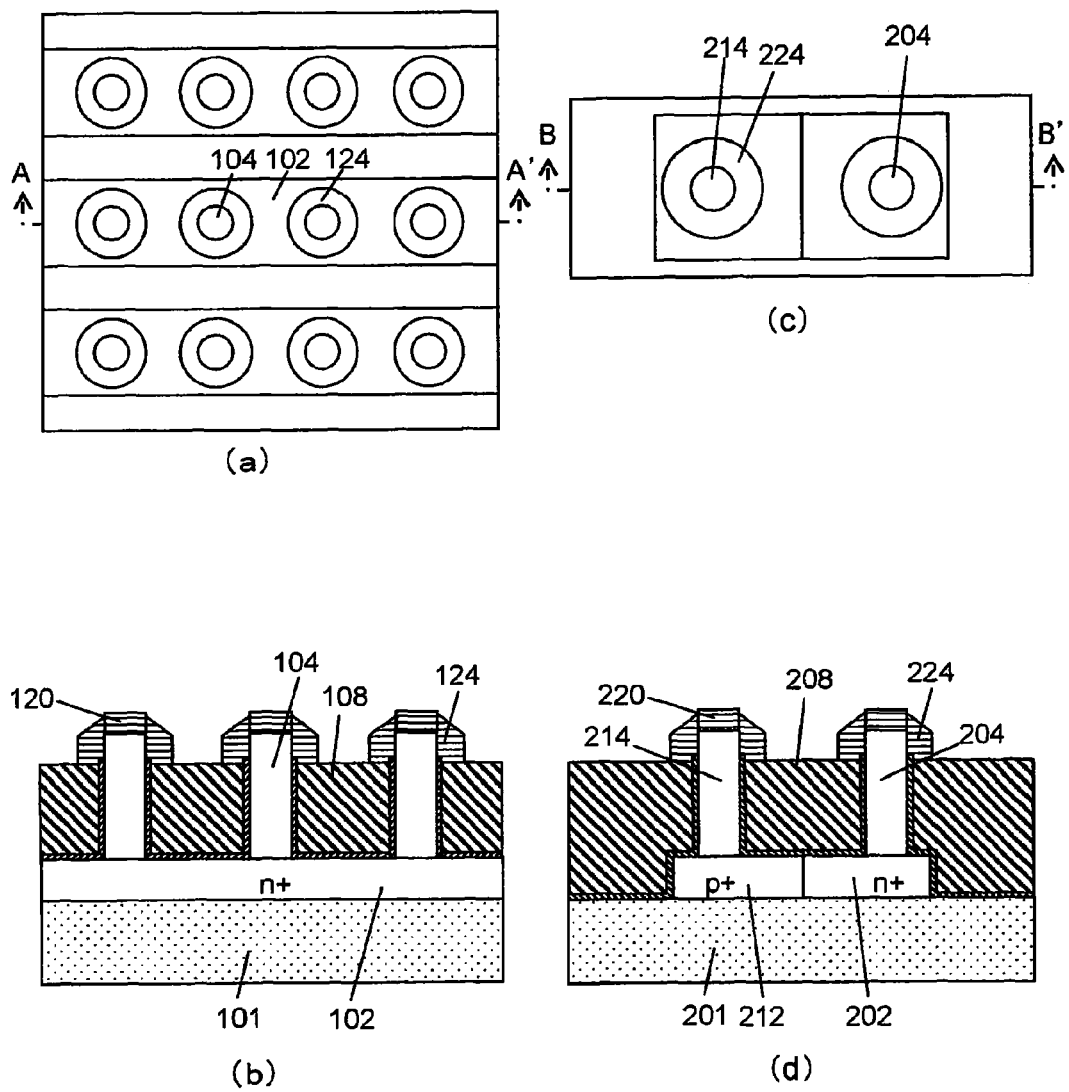
FIGS. 14(a) to 14(d) are process flow diagrams showing the production method in order of process sequence.
Figure 15:
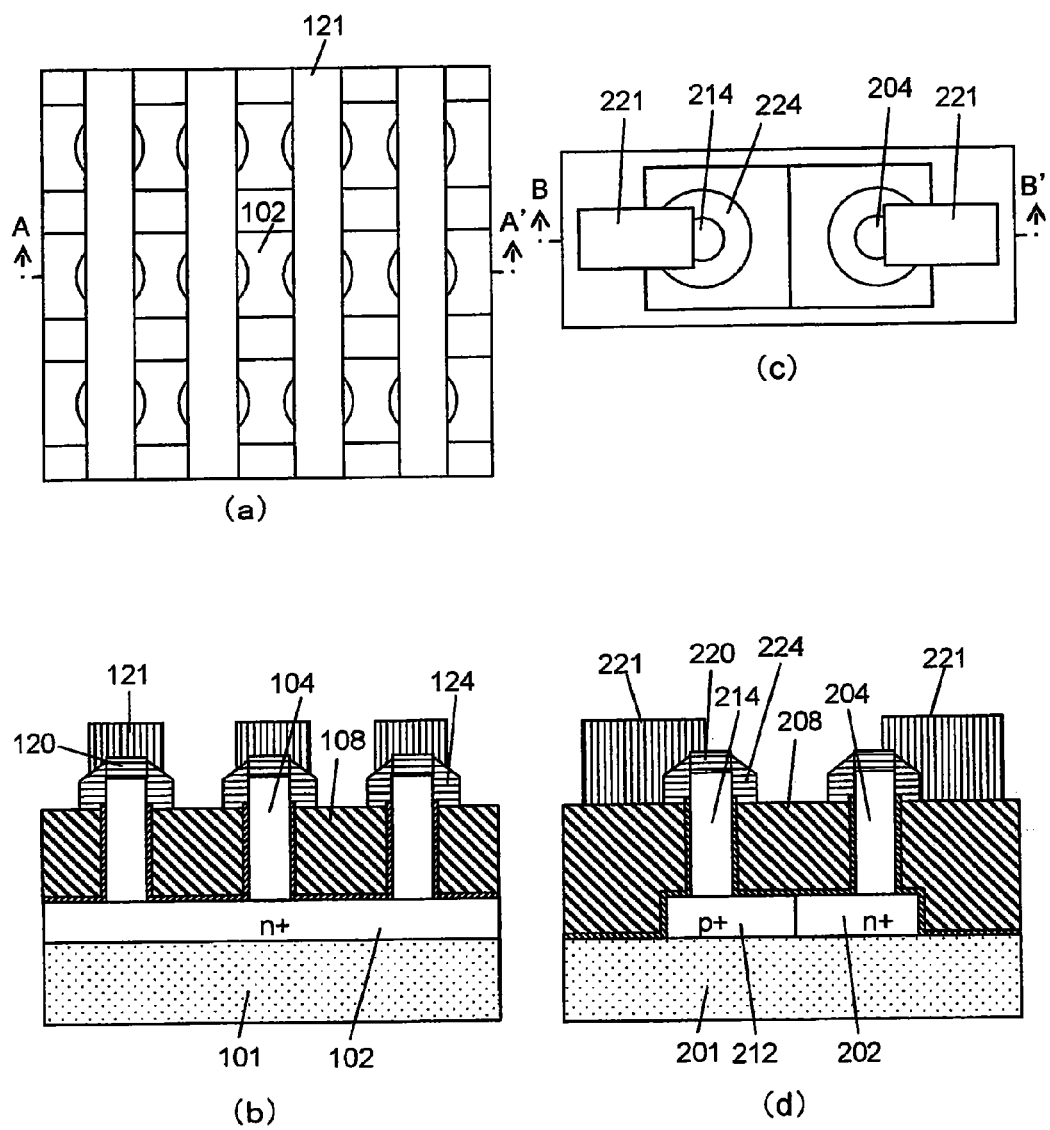
FIGS. 15(a) to 15(d) are process flow diagrams showing the production method in order of process sequence.
Figure 16:
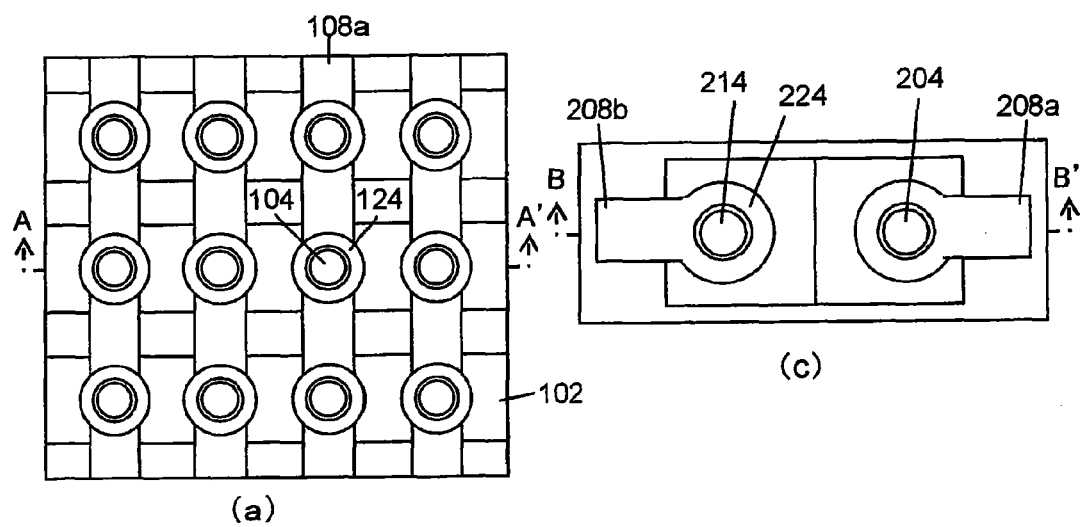
FIGS. 16(a) to 16(d) are process flow diagrams showing the production method in order of process sequence.
Figure 16:
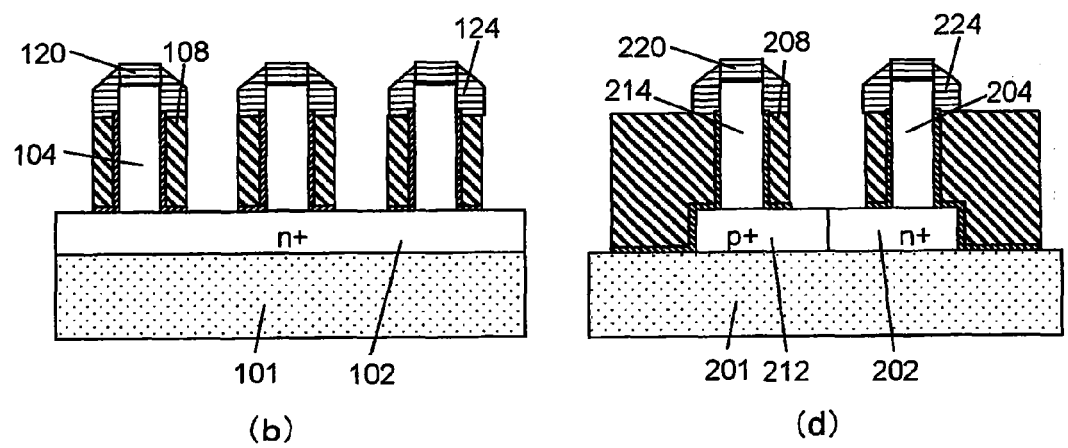
Figure 17:
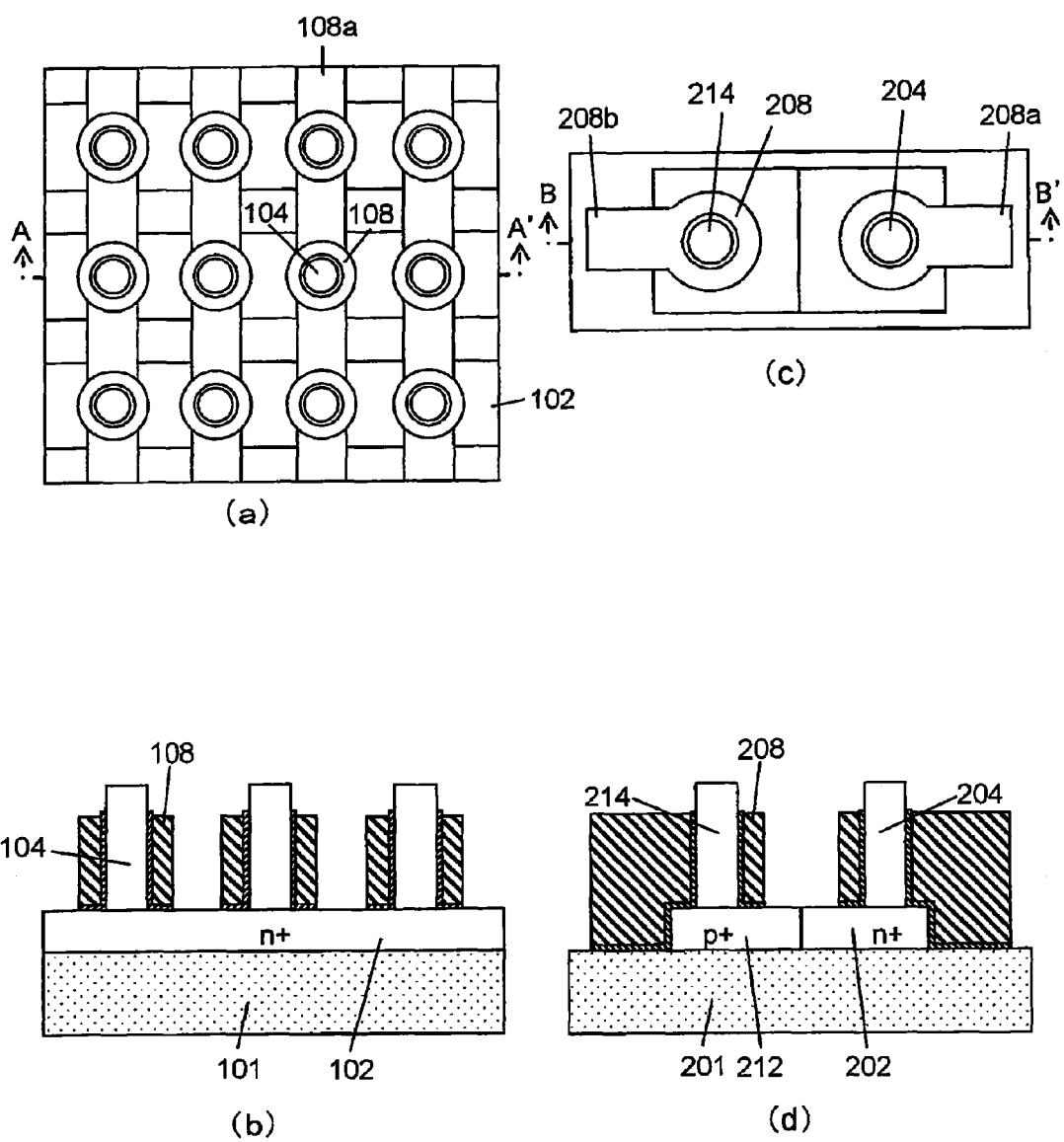
FIGS. 17(a) to 17(d) are process flow diagrams showing the production method in order of process sequence.
Figure 18:
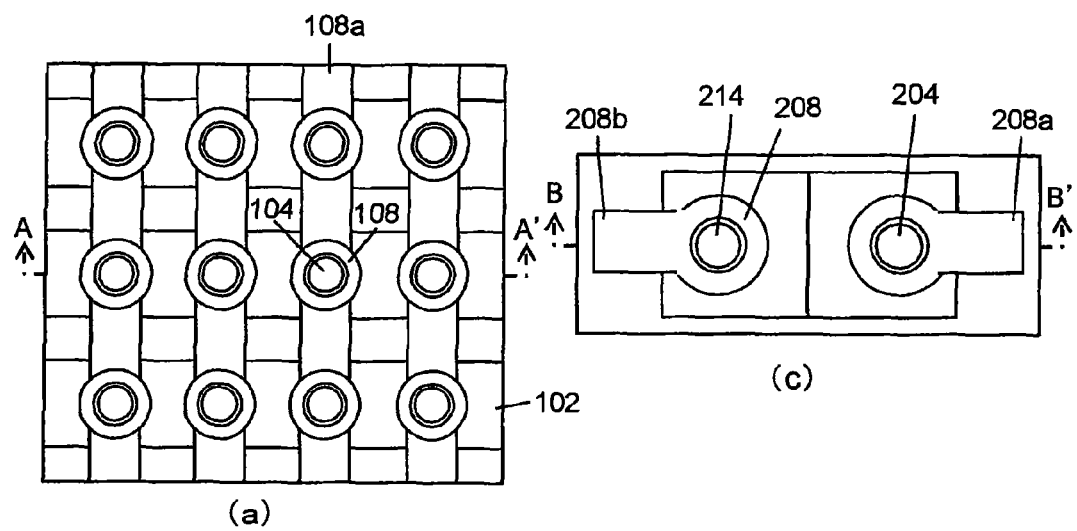
FIGS. 18(a) to 18(d) are process flow diagrams showing the production method in order of process sequence.
Figure 18:
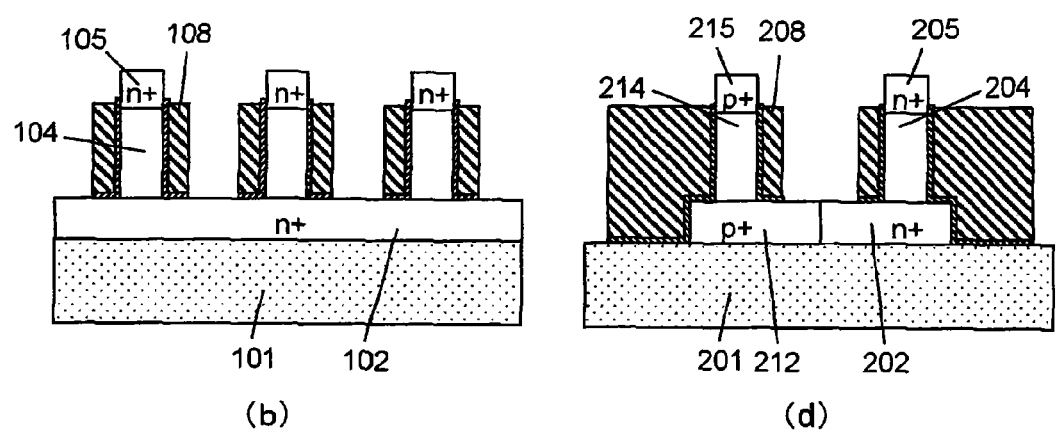
Figure 19:
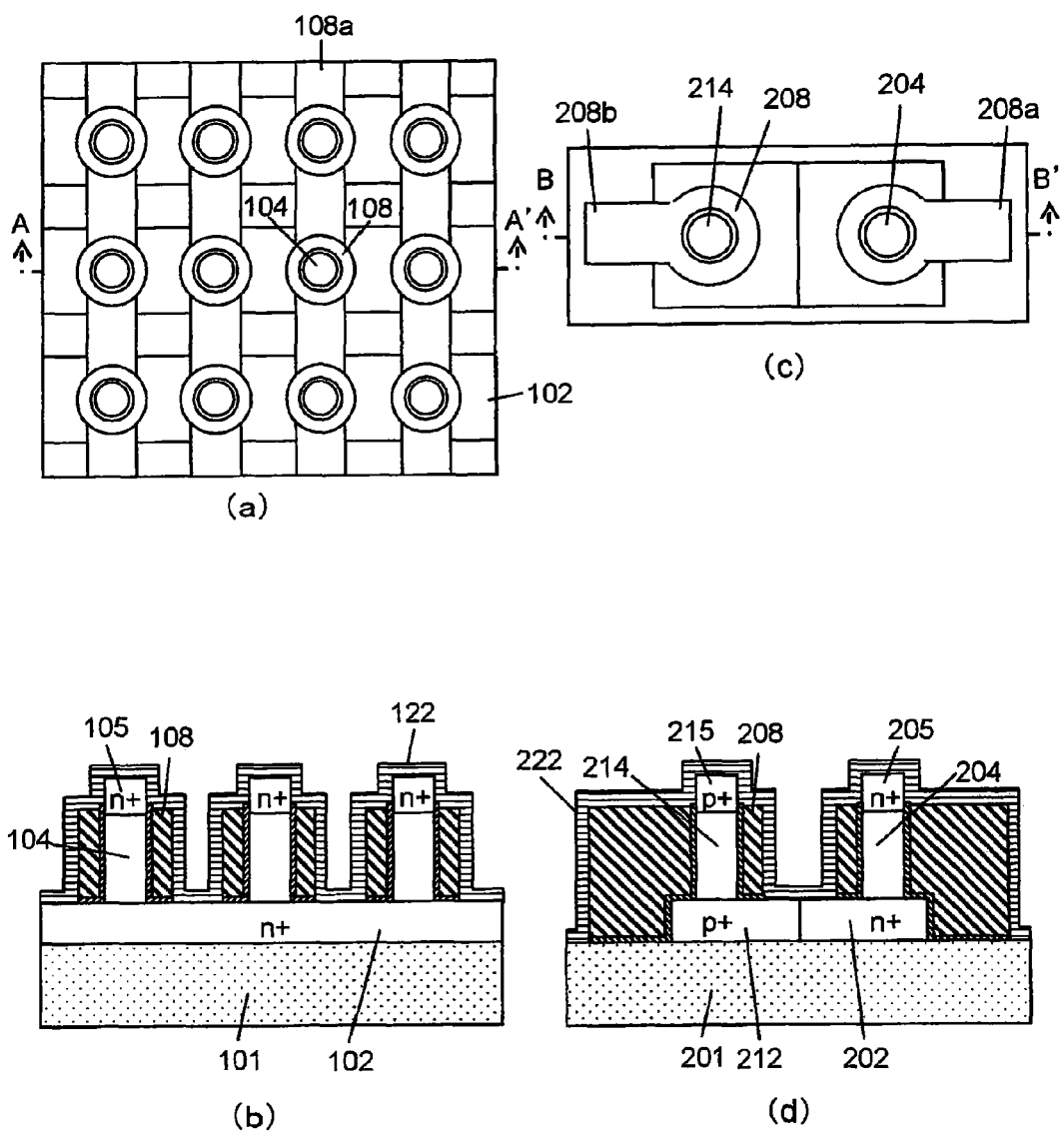
FIGS. 19(a) to 19(d) are process flow diagrams showing the production method in order of process sequence.
Figure 20:
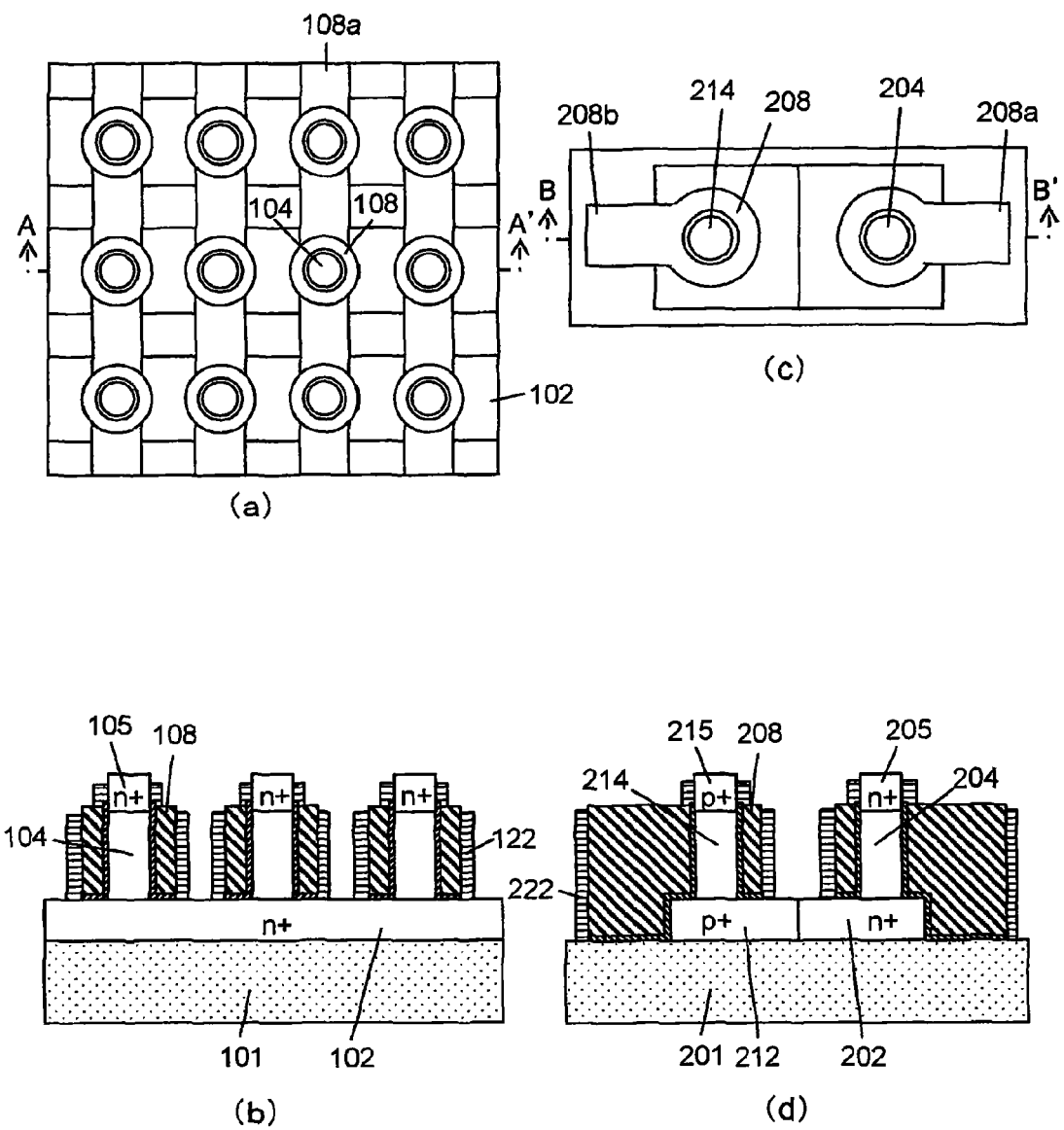
FIGS. 20(a) to 20(d) are process flow diagrams showing the production method in order of process sequence.
Figure 21:
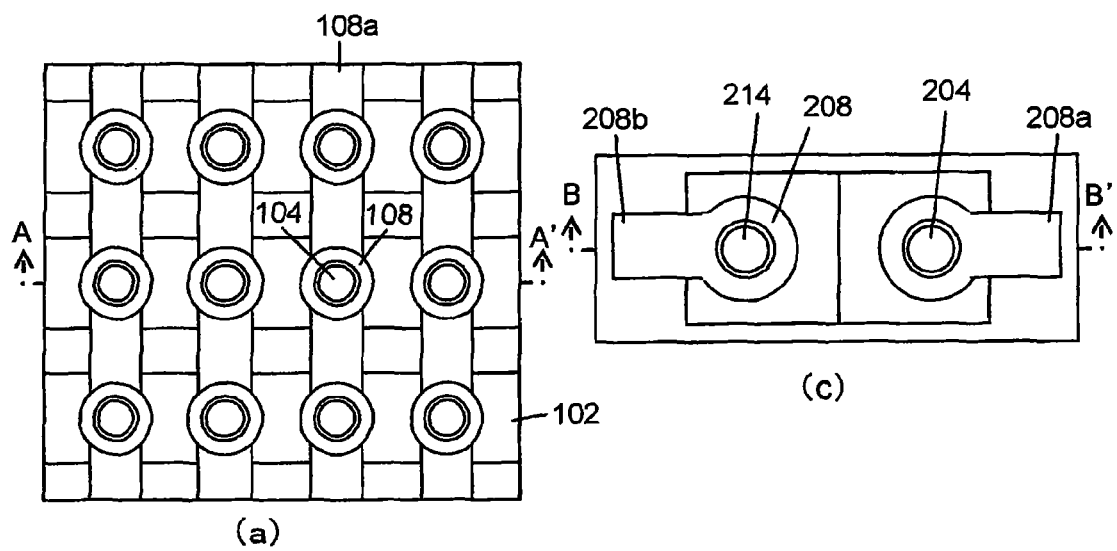
FIGS. 21(a) to 21(d) are process flow diagrams showing the production method in order of process sequence.
Figure 21:
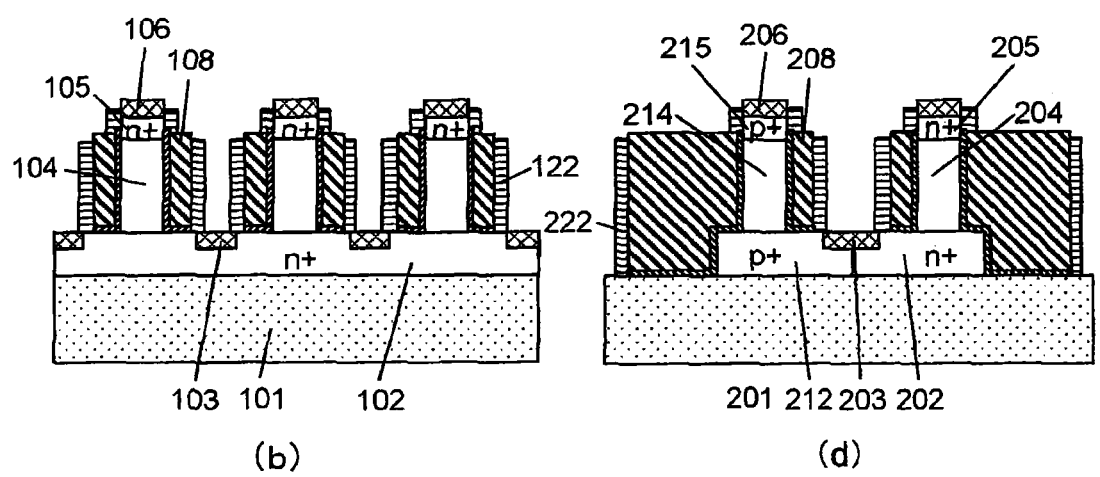
Figure 22:
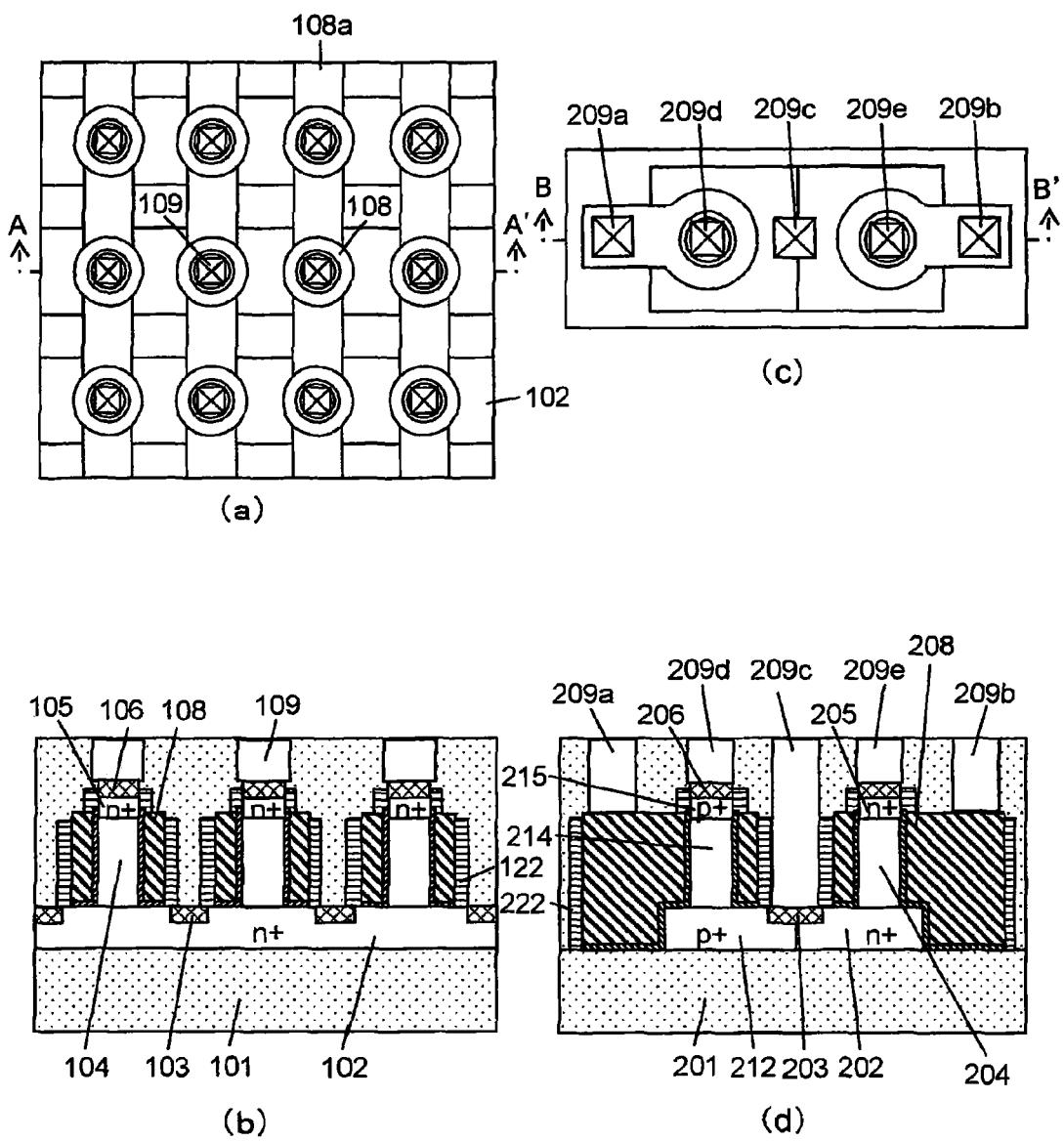
FIGS. 22(a) to 22(d) are process flow diagrams showing the production method in order of process sequence.
Figure 23:
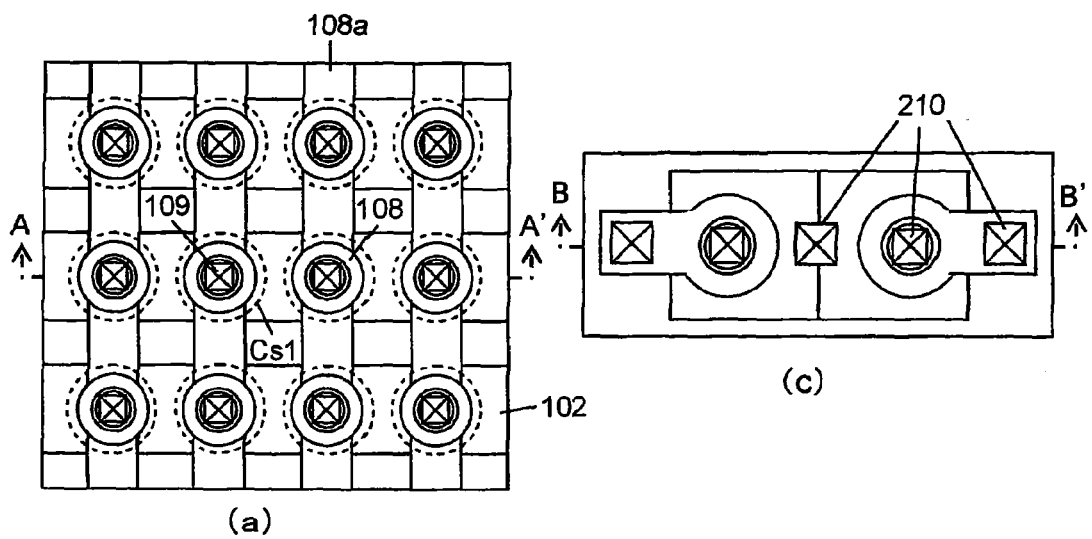
FIGS. 23(a) to 23(d) are process flow diagrams showing the production method in order of process sequence.
Figure 23:
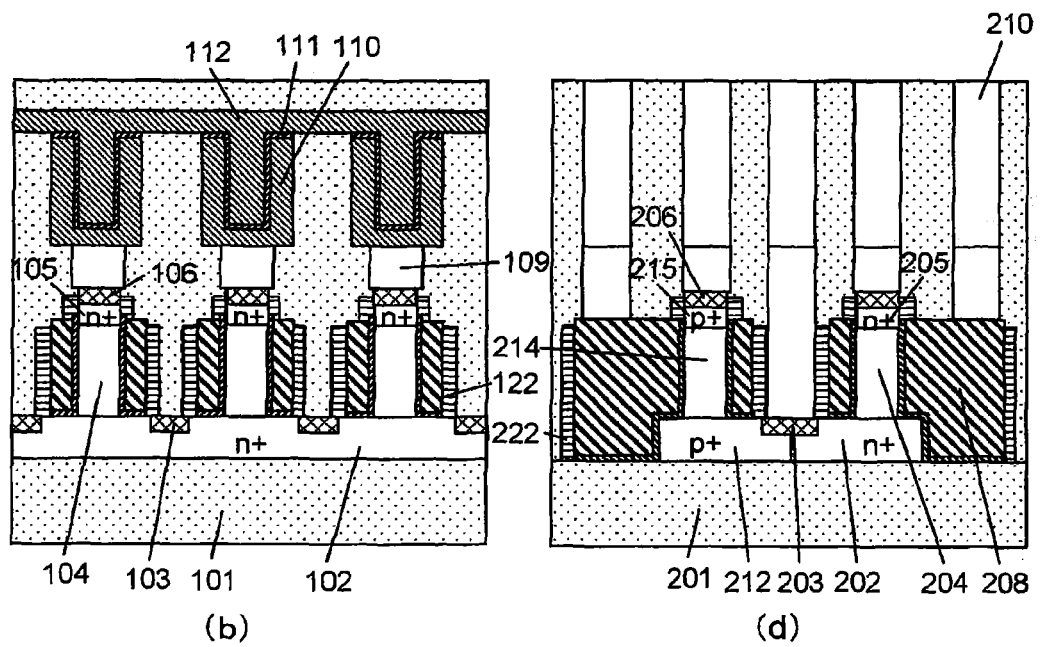

FIG. 8 is sectional view taken along the cutting-plane line A-A' in FIG. 7. With reference to the sectional view of FIG. 8, the configuration of the CMOS inverter will be more specifically described below.

The lower diffusion layer formed on the buried oxide layer 201 comprises an N$^+$ lower diffusion layer 202 and a P$^+$ lower diffusion layer 212. The silicide layer 203 is formed on respective top surfaces of the N$^+$ lower diffusion layer 202 and the P$^+$ lower diffusion layer 212, to allow the N$^+$ lower diffusion layer 202 and the P$^+$ lower diffusion layer 212 to be directly connected to each other therethrough. This eliminates a need for a contact for connecting the N$^+$ lower diffusion layer 202 and the P$^+$ lower diffusion layer 212 and an element isolation region therebetween, so that an occupied area of the CMOS inverter can be reduced. The NMOS transistor Qn 2 is formed by a pillar-shaped silicon layer 204 formed on the N$^+$ lower diffusion layer 202, and the PMOS transistor Qp 2 is formed by a pillar-shaped silicon layer 214 formed on the P$^+$ lower diffusion layer 212. A gate dielectric film 207 is formed to surround the pillar-shaped silicon layer (204, 214), and a gate electrode 208 is formed to surround the gate dielectric film 207. An N$^+$ upper diffusion layer 205 is formed in an upper portion of the NMOS-forming pillar-shaped silicon layer 204, and a P$^+$ upper diffusion layer 215 is formed in an upper portion of the PMOS-forming pillar-shaped silicon layer 214. A silicide layer 206 is formed on a top surface of the upper diffusion layer (205, 215).

The contact (209a, 209b) on the gate line (208a, 208b) extending from the gate electrode is formed in a first layer, and connected to the input line Vin 2 through a contact 210 in a second layer. The contact 209c on the silicide layer 203 on the top surfaces of the lower diffusion layers is formed in the first layer, and connected to the output line Vout 2 through a contact 210 in the second layer. The contact 209d on the upper diffusion layer 205 in the top portion of the NMOS pillar-shaped silicon layer is formed in the first layer, and connected to the ground potential line GND 2 through a contact 210 in the second layer. The contact 209e on the upper diffusion layer 215 in the top portion of the PMOS pillar-shaped silicon layer is formed in the first layer, and connected to the power source potential line Vcc 2 through a contact 210 in the second layer.

With reference to FIGS. 9(a) to 23(d), one example of a production method for the semiconductor device according to the first embodiment will be described below. In FIGS. 9(a) to 23(d), the figure suffixed by (a) is a top plan view of a DRAM cell array, and the figure suffixed by (b) is a sectional view taken along the cutting-plane line A-A' in the top plan view. Further, the figure suffixed by (c) is a top plan view of a CMOS inverter as one example of a CMOS circuit section, and the figure suffixed by (d) is a sectional view taken along the cutting-plane line B-B' in the top plan view.

As shown in FIGS. 9(a) to 9(d), an SOI substrate comprising a buried oxide layer (101, 201) and an SOI layer formed on the buried oxide layer to have a film thickness of about 200 nm is employed, and a mask (120, 220), such as a silicon nitride film, is formed on the SOI layer. Then, a pillar-shaped silicon layer (104, 204, 214) is formed by etching. During the etching, a silicon layer (102a, 202a) is also formed underneath the pillar-shaped silicon layer to have a thickness of about 50 nm.

As shown in FIGS. 10(a) to 10(d), the silicon layer (102a, 202a) is isolated by etching. Subsequently, an impurity or impurities is/are injected into the silicon layer, for example, by ion implantation, to form an N$^+$ lower diffusion layer region (102, 202) and a P$^+$ lower diffusion layer region 212. In a DRAM cell array section, the N$^+$ lower diffusion layer region 102 serves as a bit line.

As shown in FIGS. 11(a) to 11(d), a gate dielectric film (107, 207) is formed, and then a gate conductive film (108, 208) is formed by chemical vapor deposition (CVD) or atomic layer deposition (ALD) to allow the pillar-shaped silicon layer (104, 204, 214) to be buried therein.

As shown in FIGS. 12(a) to 12(d), the gate conductive film (108, 208) is polished by chemical mechanical polishing (CMP) to flatten a top surface of the gate conductive film. The flattening of the top surface of the gate conductive film by the CMP makes it possible to improve a configuration of the gate conductive film and thereby facilitate control of a gate length. During the CMP, the silicon nitride film (120, 220) on a top of the pillar-shaped silicon layer is used as a CMP stopper. The use of the silicon nitride film (120, 220) as a CMP stopper makes it possible to control an amount of CMP with high repeatability. In place of the silicon nitride film, the film to be used as a CMP stopper may be any other suitable film capable of functioning as the CMP stopper film, and such a CMP stopper film may be formed on the SOI layer in advance.

As shown in FIGS. 13(a) to 13(d), the gate dielectric film (107, 207) and the gate conductive film (108, 208) are etched back to fix a gate length.

As shown in FIGS. 14(a) to 14(d), a silicon nitride film is formed by a film thickness required for an after-mentioned gate electrode, and then is etched back to form a silicon nitride film-based sidewall (124, 224). In this method, a film thickness of the after-mentioned gate electrode is determined by the film thickness of the silicon nitride film-based sidewall (124, 224). Thus, in this step, the film thickness of the silicon nitride film is controlled such that a formed film thickness thereof is adjusted to be slightly greater than a desired thickness of the after-mentioned gate electrode, and then a final film thickness thereof is finely adjusted based on an amount of the etch-back to become equal to the desired thickness. In this method, the silicon nitride film is used as a sidewall protective film. Alternatively, any other suitable film capable of functioning as the sidewall protective film, such as a silicon oxide film, may also be used.

As shown in FIGS. 15(a) to 15(d), a resist or a multilayer resist is applied, and a gate line pattern is formed with a resist (121, 221) by lithography. In the DRAM cell array section, a word line will be formed based on the gate line 121.

As shown in FIGS. 16(a) to 16(d), the gate conductive film and the gate dielectric film are etched using the resist (121, 222) as a mask to form a gate electrode (108, 208) and a gate line (108a, 208a, 208b). In the DRAM cell array section, the gate line 108a serves as a word line.

As shown in FIGS. 17(a) to 17(d), the silicon nitride film (120, 220) and the silicon nitride film-based sidewall (124, 224) on the top and the upper portion of the pillar-shaped silicon layer are removed by dry etching or wet etching.

As shown in FIGS. 18(a) to 18(d), an impurity, such as P or As, is introduced into an upper portion of the pillar-shaped silicon layer (104, 204), for example, by impurity injection, to form an $N^+$ source diffusion layer (105, 205) therein. Further, an impurity, such as B or $BF_2$, is introduced into an upper portion of the pillar-shaped silicon layer 214, for example, by impurity injection, to form a $P^+$ source diffusion layer 215 therein.

As shown in FIGS. 19(a) to 19(d), a silicon nitride film (122, 222) is formed to have a film thickness of about 10 to 50 nm.

As shown in FIGS. 20(a) to 20(d), the silicon nitride film (122, 222) is etched back to allow a remaining silicon nitride film to cover respective sidewalls of the pillar-shaped silicon layer and the gate electrode.

As shown in FIGS. 21(a) to 21(d), a metal, such as Co or Ni, is sputtered onto the source/drain diffusion layer to form a sputtered layer therein, and the sputtered layer is subjected to a heat treatment, to silicide the source/drain diffusion layer so as to form a silicide layer (103, 203, 106, 206) on the top surface thereof.

In this step, the silicon nitride film (122, 222) covering the respective sidewalls of the pillar-shaped silicon layer and the gate electrode can suppress short-circuiting between the drain diffusion layer and the gate electrode and short-circuiting between the source diffusion layer and the gate electrode.

As shown in FIGS. 22(a) to 22(d), a silicon oxide layer as an interlayer film is formed, and then a first-layer contact (109, 209a to 209e) is formed in each of the DRAM cell array section and the CMOS inverter section.

As shown in FIGS. 23(a) to 23(d), in the DRAM cell array section, a capacitor element is formed in the same manner as that used for a conventional stacked-capacitor DRAM. The capacitor element comprises a lower electrode 110 made of a metal, a dielectric film 111, and an upper electrode 112 made of a metal. In the CMOS inverter section, after forming the capacitor element of the DRAM cell array section, a second-layer contact 210 is formed on the first-layer contact (209a to 209e) to form a connection with a line layer.

In the first embodiment, all the contacts are made of a metal, and each of the electrodes of the capacitor element is also made of a metal. Differently, in the conventional stacked-capacitor DRAM, a part of a plurality of contacts and a capacitor electrode are often made of impurity-doped polysilicon. In a contact or a capacitor element made of polysilicon, an impurity distribution in a transistor is likely to be affected by a heat history during a film forming process and activation heat treatment, to cause deterioration in short-channel characteristics and fluctuation in threshold due to escape of boron. Thus, in cases where a transistor having a relatively short gate length is used, a contact or an electrode of a capacitor element has to be made of a metal capable of being formed into a film (film formation temperature: 500° C. or less), such as TiN or W, without using a material requiring a relatively high temperature (600 to 700° C.), such as polysilicon.

In the first embodiment, the selection transistor in the DRAM cell array section and the transistor in the peripheral or logic circuit section are formed in substantially the same structure, so that the number of production processes can be reduced. In addition, the capacitor element in the DRAM can be formed by the same technique as that used for the conventional stacked-capacitor DRAM, so that it is not necessary to newly develop the capacitor element.

In the first embodiment, in the peripheral or logic circuit section using a CMOS circuit, the $N^+$ lower diffusion layer and the $P^+$ lower diffusion layer can be directly connected to each other through the silicide layer formed on the respective top surfaces of the lower diffusion layers. This eliminates a need for a contact for connecting the $N^+$ lower diffusion layer and the $P^+$ lower diffusion layer and an element isolation region therebetween, so that an occupied area of the CMOS circuit can be reduced. Generally, in a conventional DRAM, about one-half of an entire chip area is occupied by a peripheral circuit, and a large portion of the peripheral circuit consists of a CMOS circuit. Thus, the above functions have a potential to effectively reduce a chip area. Further, in a DRAM-embedded logic device, a large portion of a logic circuit section other than a DRAM consists of a CMOS circuit. Thus, the area reduction effect becomes larger.

In the first embodiment, a silicide layer is formed in the source/drain diffusion layer of the transistor in the CMOS circuit section, so that a parasitic resistance of a source/drain region can be reduced. This makes it possible to form a high-performance transistor.

Second Embodiment

Figure 24:
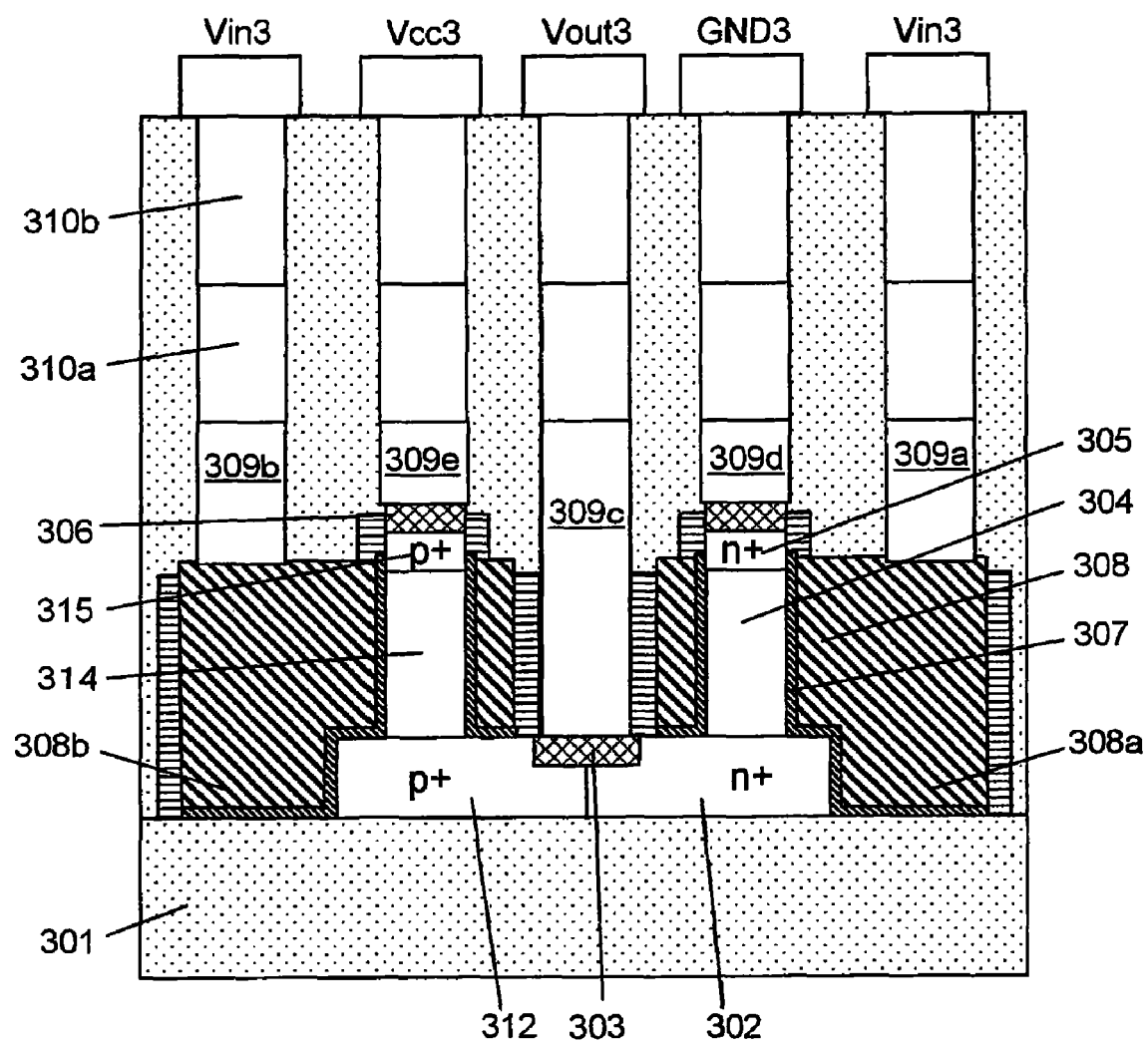
FIG. 24 is a sectional view of a CMOS inverter as one example of a peripheral circuit according to a second embodiment of the present invention.

FIG. 24 is a sectional view showing a configuration of a CMOS inverter section according to a second embodiment of the present invention. Except a configuration of a CMOS circuit section, such as a CMOS inverter, in sectional view, the remaining configuration in the second embodiment is the same as that in the first embodiment.

In the first embodiment, the contact of the CMOS inverter section is formed in a two-layer structure. However, as a cell size of a DRAM becomes smaller, a height dimension of a capacitor element Cs1 has to be increased to adequately ensure an amount of electric charges to be accumulated, so that the second-layer contact 210 is increased in depth, which is likely to cause difficulty in forming the second-layer contact from a processed top surface. In this case, as shown in FIG. 24, the second-later contact 210 may be dividedly formed using a second-layer sub-contact 310a and a third-layer sub-contact 310b to facilitate formation of a contact. This contact structure makes it possible to readily form a contact while adequately ensuring an amount of electric charges to be accumulated, even if a capacitor element is required to have a relatively large height dimension.

Third Embodiment

A third embodiment of the present invention provides a structure and a production method for a DRAM cell array section without silicidation. In the first embodiment, silicidation is also performed in the DRAM cell array section. However, the silicidation of the diffusion layer of the selection transistor in the DRAM cell is essentially required to increase an impurity concentration in the source/drain region, which causes deterioration in hold characteristics. The third embodiment can provide a DRAM having adequate hold characteristics, although the number of production processes is increased.

Except that no silicide layer is formed in a top surface of each of lower and upper diffusion layers, a configuration of the DRAM cell array section in top plan view is the same as that in FIG. 3.

Figure 25:
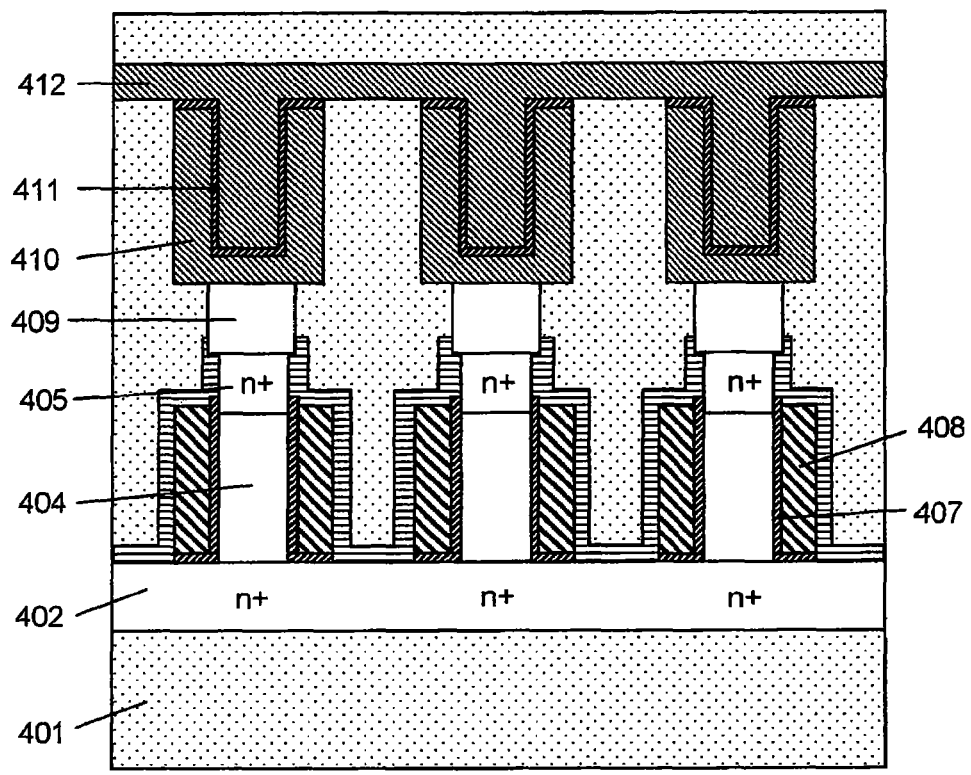
FIG. 25 is a sectional view showing a cell array of a DRAM according to a third embodiment of the present invention.
Figure 26:
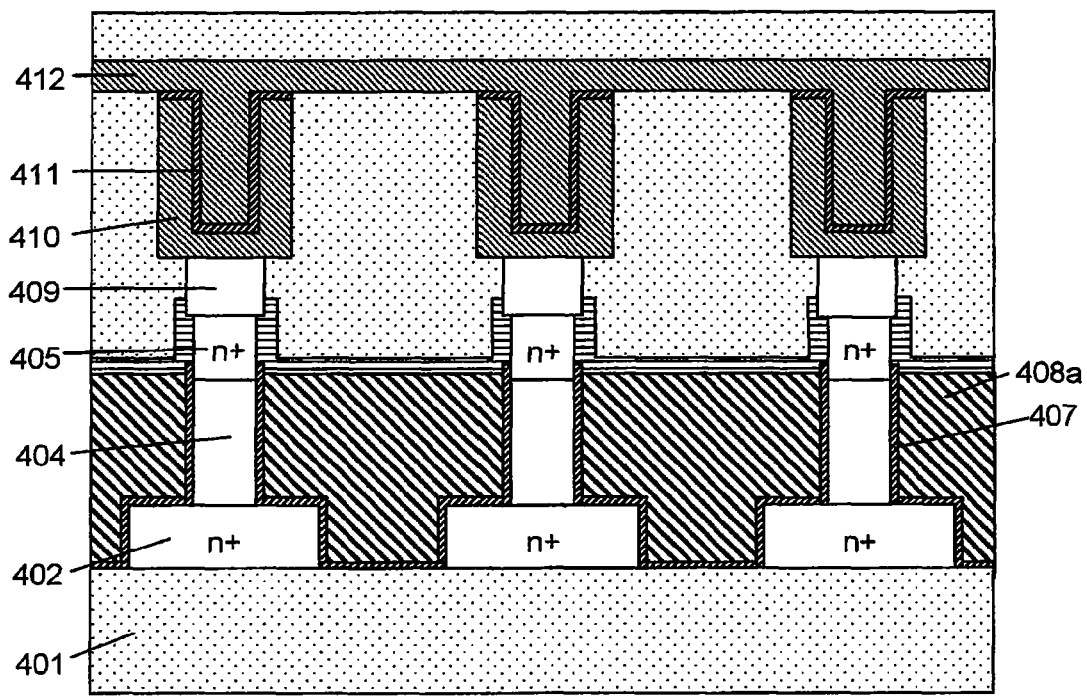
FIG. 26 is a sectional view showing the DRAM cell array in the third embodiment.

With reference to FIGS. 25 and 26, the configuration of the DRAM cell array section will be described below. FIG. 25 is a sectional view taken along a cutting-plane line corresponding to the cutting-plane line A-A' in FIG. 3, and FIG. 26 is a sectional view taken along a cutting-plane line corresponding to the cutting-plane line B-B' in FIG. 3.

A lower diffusion layer 402 is formed on a buried oxide layer 401. The lower diffusion layer 402 serves as a bit line BL(n) which is shared by a plurality of selection transistors having a common sense amplifier, and connected to a peripheral circuit at an end of the cell array. A plurality of pillar-shaped silicon layers 404 are formed on the lower diffusion layer 402 comprising a silicon layer, and a gate dielectric film 407 and a gate electrode 408 are formed to surround each of the pillar-shaped silicon layers 404. A gate line 408a extending from the gate electrodes 408 serves as a word line WL(n) which is shared by a plurality of selection transistors having a common word driver circuit, and connected to a peripheral circuit at an end of the cell array. An upper diffusion layer 405 is formed in an upper portion of each of the pillar-shaped silicon layers, and connected to a contact 409 which is connected to a lower electrode 410 of a capacitor element Cs1. The capacitor element Cs1 has an upper electrode 412 formed on the lower electrode 410 through a capacitor dielectric film 411.

Figure 27:
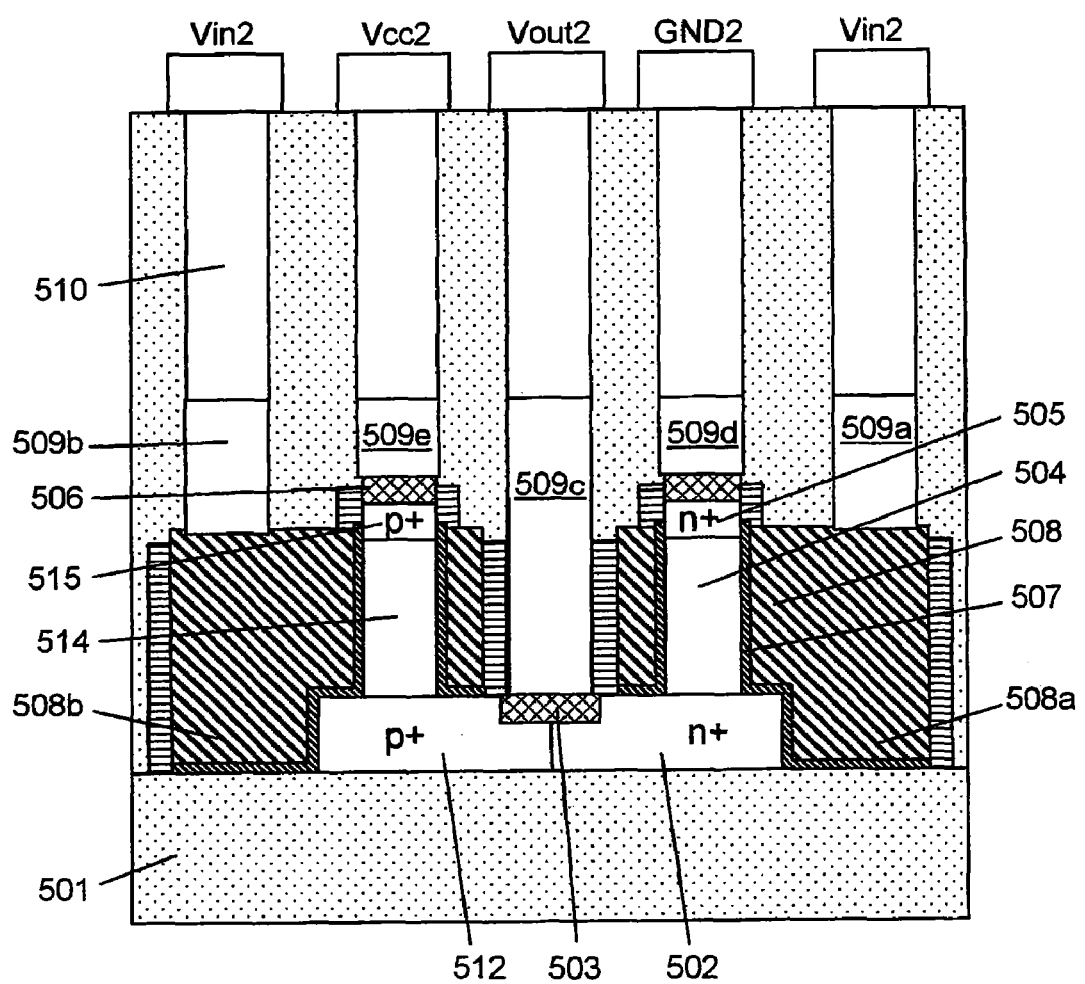
FIG. 27 is a sectional view of a CMOS inverter as one example of a peripheral circuit according to the third embodiment.

FIG. 27 is a sectional view showing a CMOS inverter as one example of the CMOS circuit section. The CMOS inverter has the same configuration as that in the first embodiment, wherein a silicide layer (503, 506) is formed in the source/drain diffusion layer.

Figure 28:
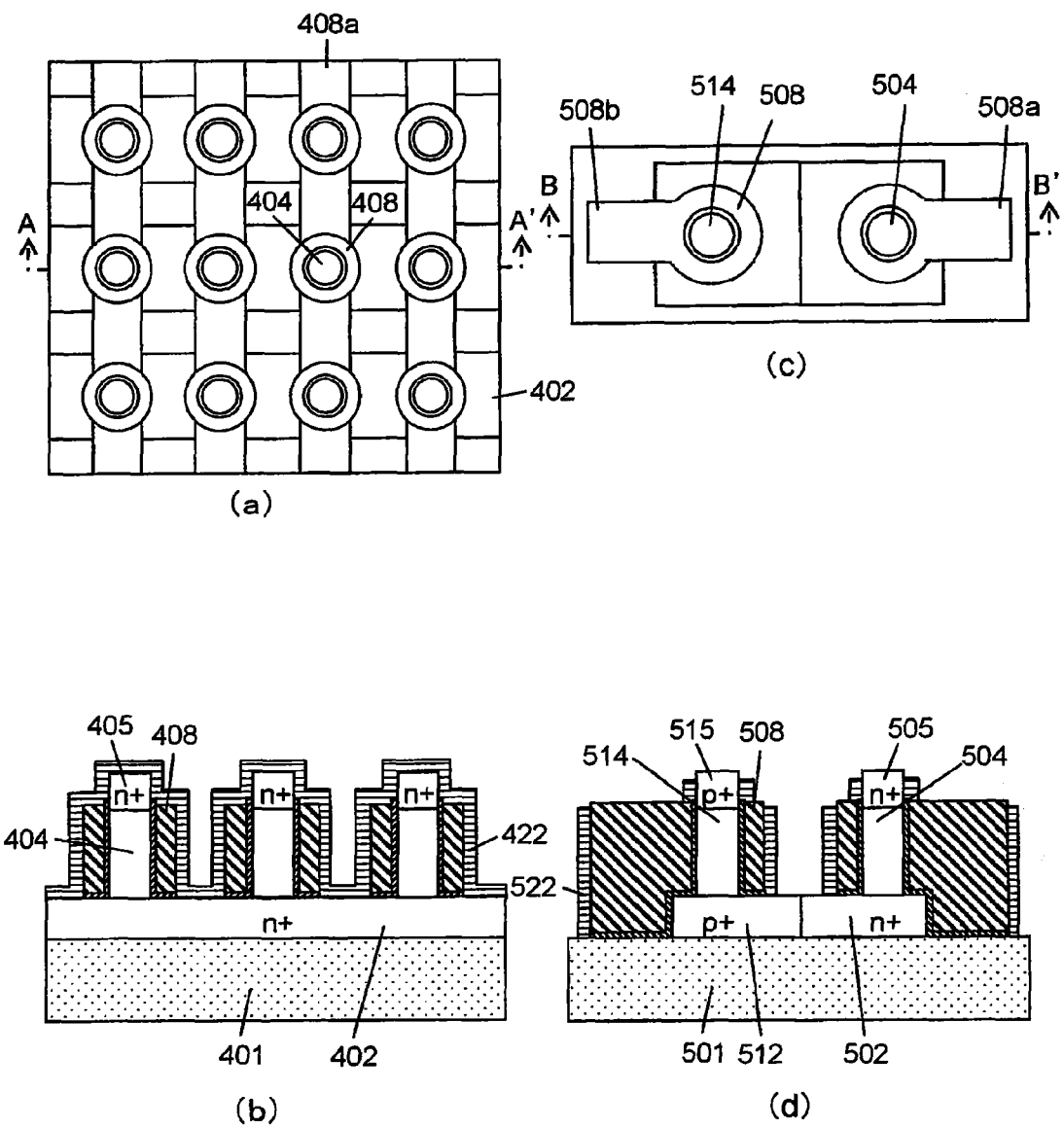
FIGS. 28(a) to 28(d) are process flow diagrams showing a production method according to the third embodiment, in order of process sequence.
Figure 29:
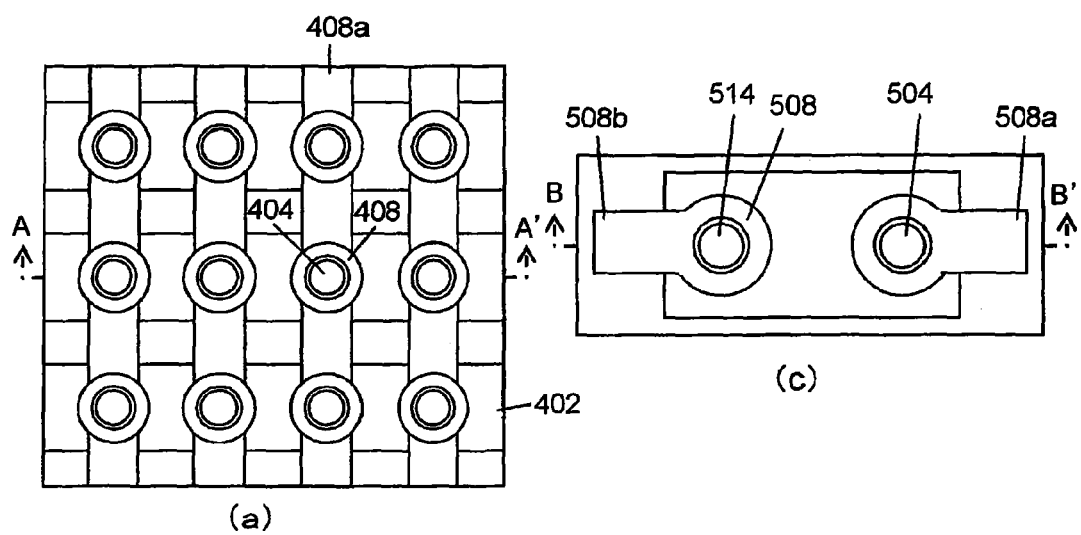
FIGS. 29(a) to 29(d) are process flow diagrams showing the production method according to the third embodiment, in order of process sequence.
Figure 29:
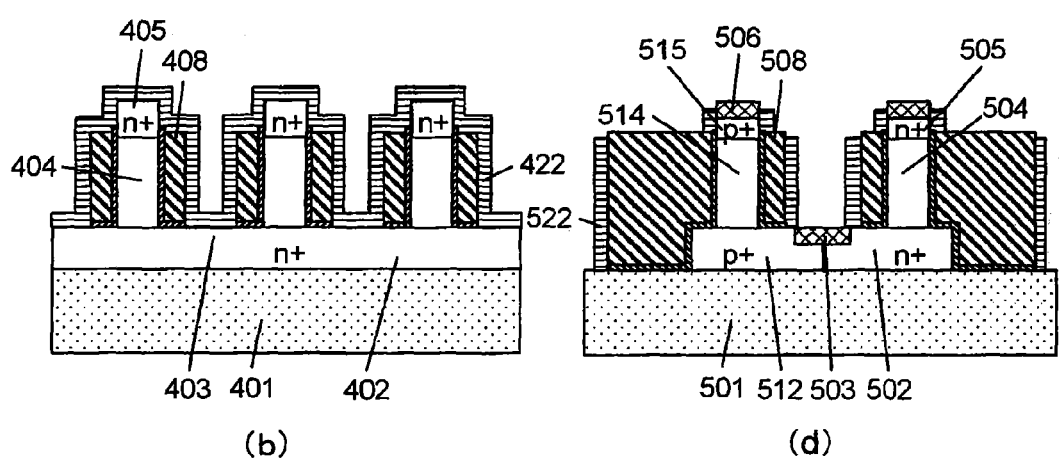

With reference to FIGS. 28(a) to 29(d), one example of a production method for the semiconductor device according to the third embodiment will be described below. In FIGS. 28a(a) to 29(d), the figure suffixed by (a) is a top plan view of a DRAM cell array, and the figure suffixed by (b) is a sectional view taken along the cutting-plane line A-A' in the top plan view. Further, the figure suffixed by (c) is a top plan view of a CMOS inverter as one example of a CMOS circuit section, and the figure suffixed by (d) is a sectional view taken along the cutting-plane line B-B' in the top plan view.

The step of forming a silicon nitride film and any step therebefore are the same as those in the first embodiment. Thus, the following description will be made about only steps after the silicon nitride film-forming step.

As shown in FIGS. 28(a) to 28(d), a silicon nitride film 522 only in a peripheral circuit section is etched back to expose a source/drain layer, while keeping a DRAM cell array section covered by a section a silicon nitride layer 422.

As shown in FIGS. 29(a) to 29(d), a metal, such as Co or Ni, is sputtered onto the source/drain diffusion layer only in the CMOS inverter section to form a sputtered layer therein, and the sputtered layer is subjected to a heat treatment, to selectively silicide the source/drain diffusion layer in the CMOS inverter section so as to form a silicide layer 503 and a silicide layer 506 on a top surface of the lower diffusion layer and a top surface of the upper diffusion layer, respectively.

The step of forming contacts and any step thereafter are the same as those in FIGS. 22(a) to 23(d). Thus, its description will be omitted here.

As above, the third embodiment makes it possible to simultaneously form a selection transistor having adequate hold characteristics in the DRAM cell array section, and a high-performance transistor in the peripheral circuit section.

Fourth Embodiment

Figure 30:
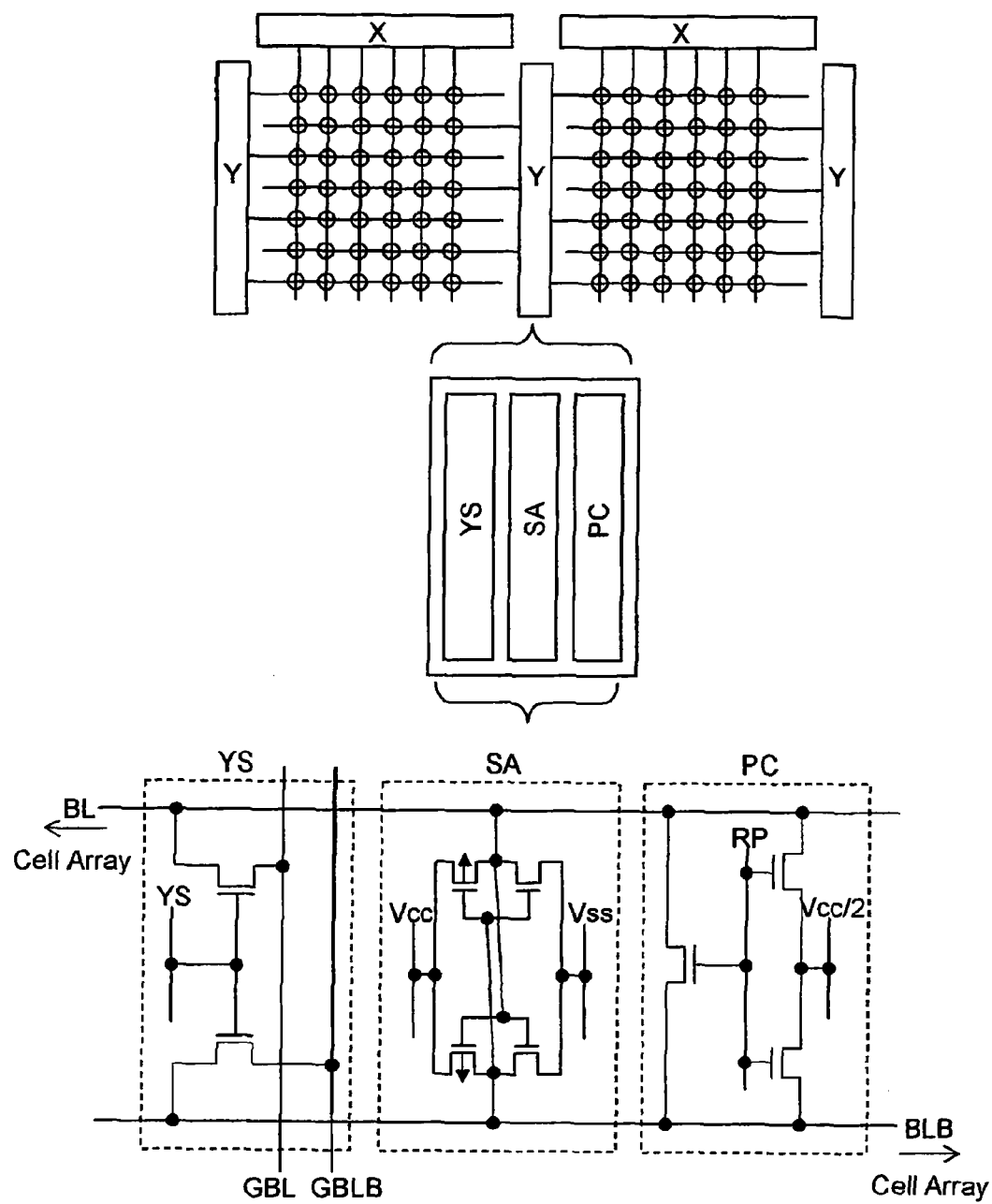
FIG. 30 is a diagram showing a configuration of a cell array of a DRAM according to a fourth embodiment of the present invention, and an equivalent circuit diagram of a peripheral circuit of the DRAM.

FIG. 30 is a schematic diagram showing a cell array section and a peripheral circuit section of a DRAM according to a fourth embodiment of the present invention, and an equivalent circuit diagram of the peripheral circuit section in a direction of a data line. In FIG. 30, a pre-charge circuit PC, a sense amplifier SA and a row selection switch YS are shown as basic circuits of the peripheral circuit section. A DRAM cell array is configured as a cross point type where a plurality of cells are arranged at respective ones of a plurality of interacting point of a plurality of bit lines with a plurality of word lines. The bit lines are configured as an open-type bit line where a pair of bit lines connected to a sense amplifier are formed in respective ones of two different cell arrays arranged on right and left sides of the sense amplifier. Thus, it is necessary to design the circuits in such a manner as to allow them to be arranged within a width which is two times a pitch of the bit lines, i.e., within a width of 4F.

One example of a layout capable of arranging the circuits within a width of 4F will be described below.

Figure 31:
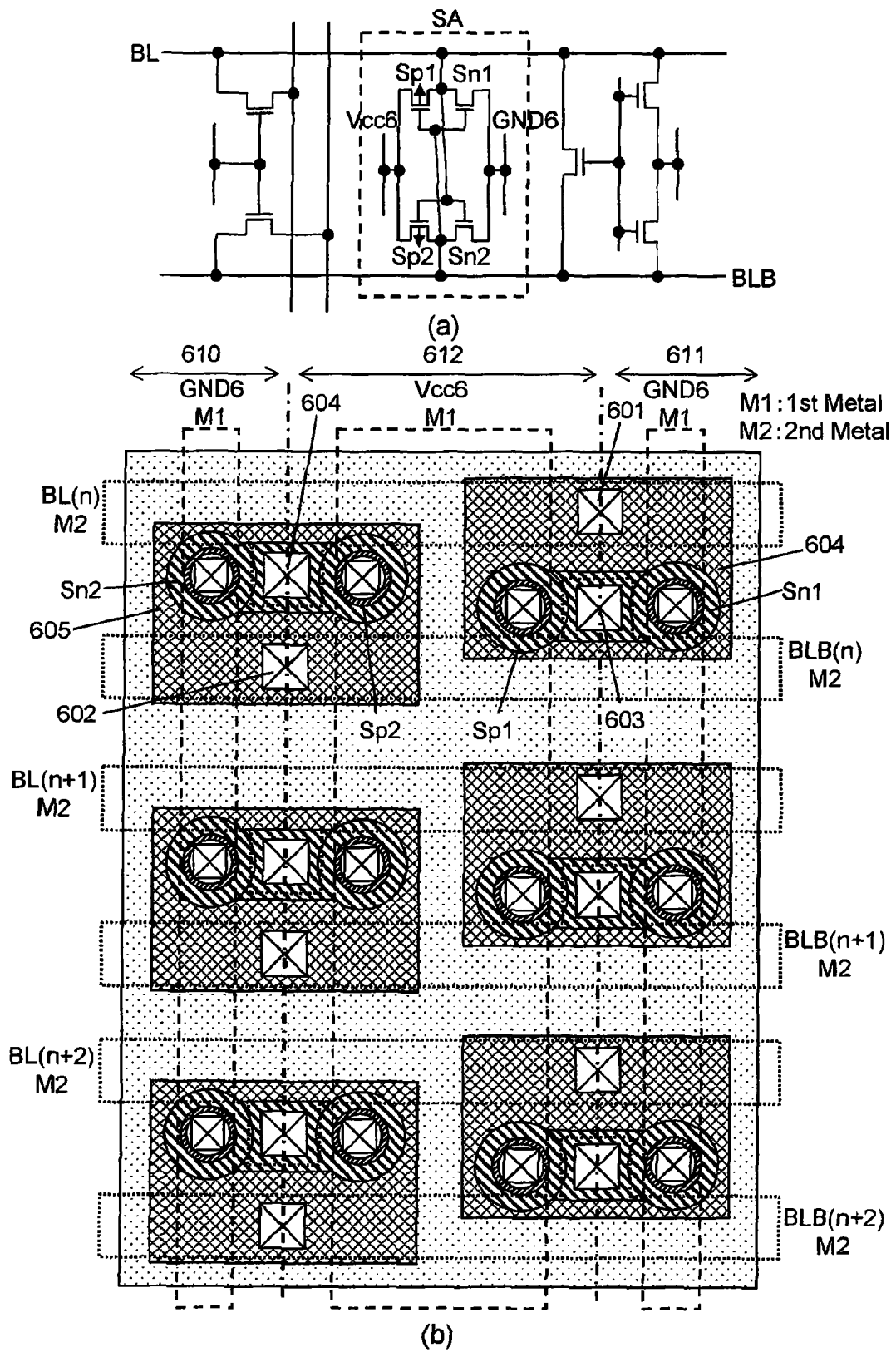
FIGS. 31(a) and 31(b) are, respectively, an equivalent circuit and a top plan view of a sense amplifier as the peripheral circuit of the DRAM according to the fourth embodiment.

FIG. 31(a) illustrates an equivalent circuit of the sense amplifier SA, and FIG. 31(b) illustrates a layout of the sense amplifier SA. As shown in FIG. 31(a), the sense amplifier comprises two NMOS transistors Sn1 and Sn2, and two PMOS transistors Sp1 and Sp2. Each of the Sn1 and Sn2 is connected to a ground potential GND 6, and each of the Sp1 and Sp2 is connected to a power supply potential Vcc 6. The sense amplifier is operable to amplify a small potential difference $\Delta V$ between a pair of bit lines BL, BLB, due to electric charges read from a memory cell, to the Vcc.

With reference to FIG. 31(b), a layout of the sense amplifier will be described below. Each of a bit lines BL(n) and a bit line BLB(n) in a sense amplifier section is made up of a second metal layer line. Each of a Vcc 6 line fixed to the power supply potential and a GND 6 line fixed to the ground potential is made up of a first metal layer line. The bit line BL(n) is connected to a contact 601 formed on a diffusion layer 604 having a silicide layer formed on a top surface thereof, and connected to respective lower diffusion layers of the NMOS transistor Sn1 and the PMOS transistor Sp1. The bit line BLB(n) is connected to a contact 602 formed on a diffusion layer 605 having a silicide layer formed on a top surface thereof, and connected to respective lower diffusion layers of the NMOS transistor Sn2 and the PMOS transistor Sp2. Further, the bit line BL(n) is connected to a contact 604 formed on a gate line extending from respective gate electrodes of the Sn2 and Sp2, and the bit line BLB(n) is connected to a contact 603 formed on a gate line extending from respective gate electrodes of the Sn1 and Sp1. A contact formed on respective upper diffusion layers of the NMOS transistors Sn1, Sn2 is connected to the GND 6 line formed as the first metal layer line and fixed to the ground potential, and a contact formed on respective upper diffusion layers of the PMOS transistors Sp1, Sp2 is connected to the Vcc 6 line formed as the first metal layer line and fixed to the power supply potential.

In an $N^+$ injection region (610, 611) illustrated in FIG. 31(b), an imparity, such as P or As, is injected to allow the lower diffusion layer to be formed as an $N^+$ diffusion layer. In a $P^+$ injection region 612 illustrated in FIG. 31(b), an imparity, such as B or BF2, is injected to allow the lower diffusion layer to be formed as a $P^+$ diffusion layer. The $N^+$ diffusion layer and the $P^+$ diffusion layer are directly connected to each other through the silicide layer formed on respective top surfaces thereof. This eliminates a need for a contact for connecting the $N^+$ diffusion layer and the $P^+$ diffusion layer and an element isolation region therebetween, so that an occupied area of the circuit can be reduced.

Although each of the transistors Sn1, Sn2, Sp1, Sp2 constituting the sense amplifier in the fourth embodiment is made up of an SGT comprising a single pillar-shaped silicon layer, the transistor may be made up of an SGT comprising a plurality of pillar-shaped silicon layers, depending on a performance requirement of the circuit.

Figure 32:
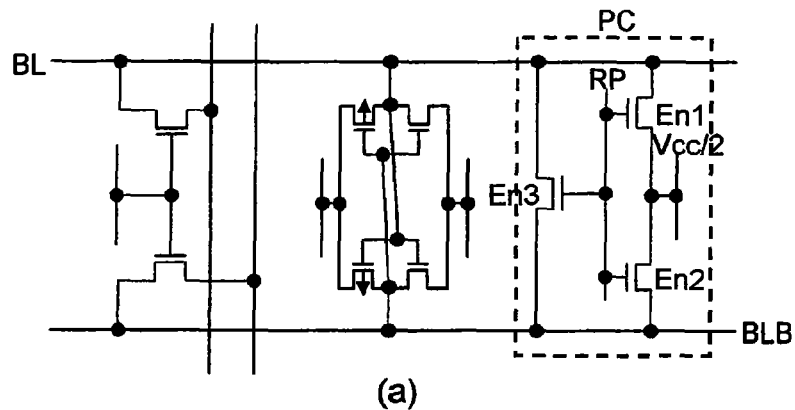
FIGS. 32(a) and 32(b) are, respectively, an equivalent circuit and a top plan view of a pre-charge circuit as the peripheral circuit of the DRAM according to the fourth embodiment.
Figure 32:
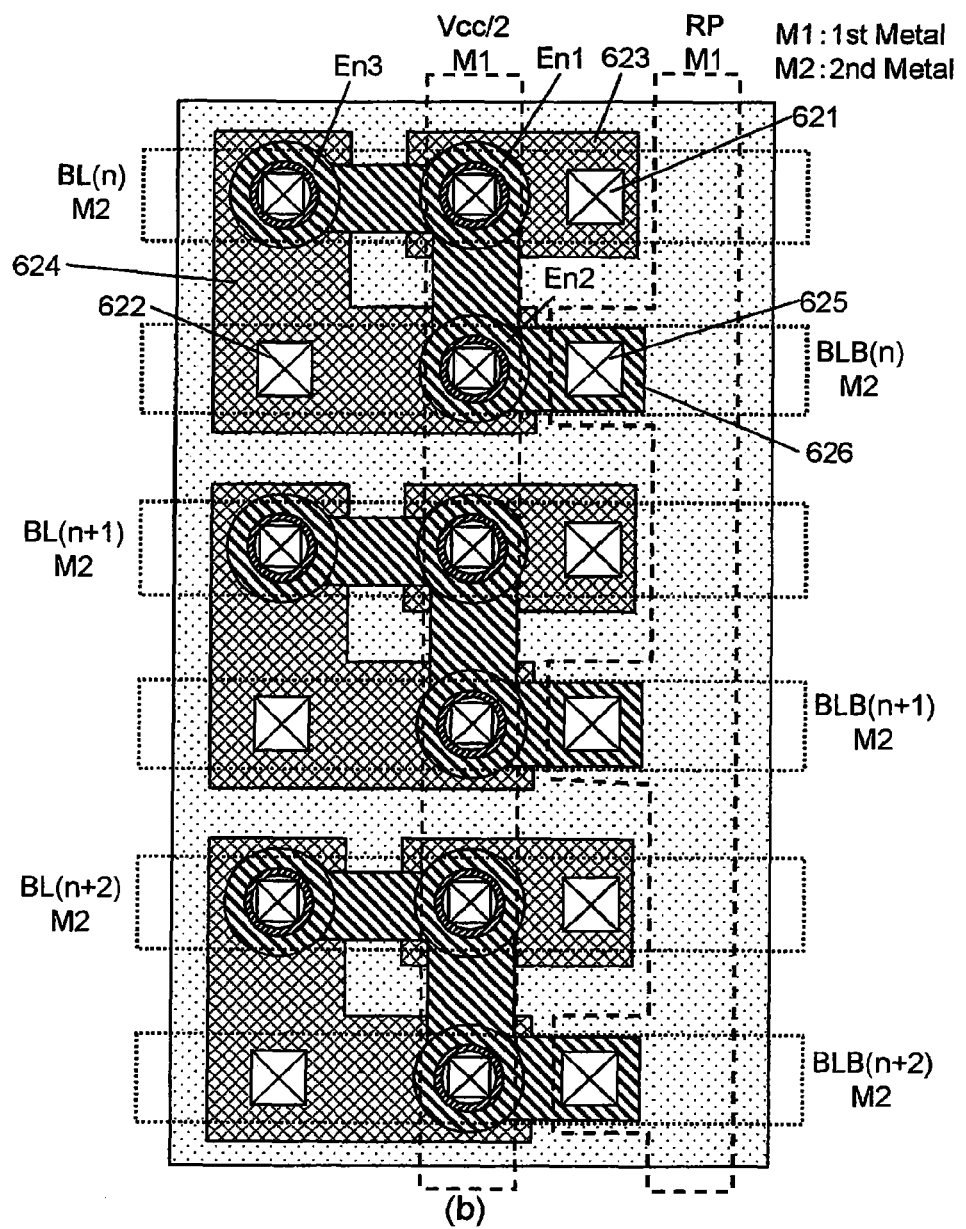

FIG. 32(a) illustrates an equivalent circuit of the pre-charge circuit PC, and FIG. 32(b) illustrates a layout of the pre-charge circuit PC. With reference to FIG. 32(a), one example of an operation of the pre-charge circuit will be described below. The pre-charge circuit comprises an NMOS transistor En1 connecting a bit line BL and a Vcc/2 line fixed to a voltage which is one-half of a power supply potential, an NMOS transistor En2 connecting a bit line BLB and the Vcc/2 line fixed to the voltage which is one-half of the power supply potential, and an NMOS transistor En3 connecting the bit line BL and the bit line BLB. When data of "1" is input into a pre-charge signal line RP, all the transistors En1, En2, En3 are turned on to form the connection between the bit line BL and the Vcc/2 line, the connection between the bit line BLB and the Vcc/2 line and the connection between the bit line BL and the bit line BLB, so that both the bit lines BL, BLB are pre-charged to Vcc/2.

With reference to FIG. 32(b), a layout of the pre-charge circuit will be described below. Each of a bit line BL(n) and a bit line BLB(n) in a pre-charge circuit section is made up of a second metal layer line, and each of a Vcc/2 line and a pre-charge signal line RP in the pre-charge circuit section is made up of a first metal layer line. The bit line BL(n) is connected to a contact 621 formed on an $N^+$ diffusion layer 623 having a silicide layer formed on a top surface thereof, and connected to the Vcc/2 line through the En1. The bit line BLB(n) is connected to a contact 622 formed on an $N^+$ diffusion layer 624 having a silicide layer formed on a top surface thereof, and connected to the Vcc/2 line through the En2. Further, the bit line BL(n) is connected to an upper diffusion layer of the En3 through a contact formed on the En3. A gate electrode of each of the transistors En1 to En3 is connected to the pre-charge signal line RP through a contact 625 formed on a gate line 626, to control an operation of the circuit.

Although each of the transistors En1, En2, En3 constituting the pre-charge circuit in the fourth embodiment is made up of an SGT comprising a single pillar-shaped silicon layer, the transistor may be made up of an SGT comprising a plurality of pillar-shaped silicon layers, depending on a performance requirement of the circuit.

Figure 33:
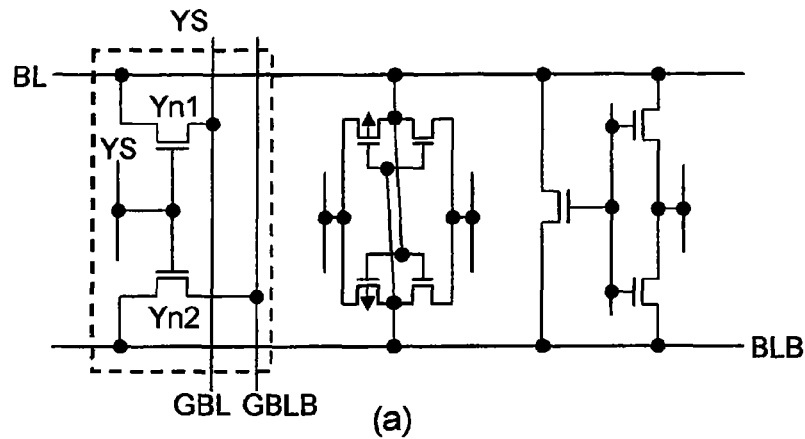
FIGS. 33(a) and 33(b) are, respectively, an equivalent circuit and a top plan view of a row selection switch as the peripheral circuit of the DRAM according to the fourth embodiment.
Figure 33:
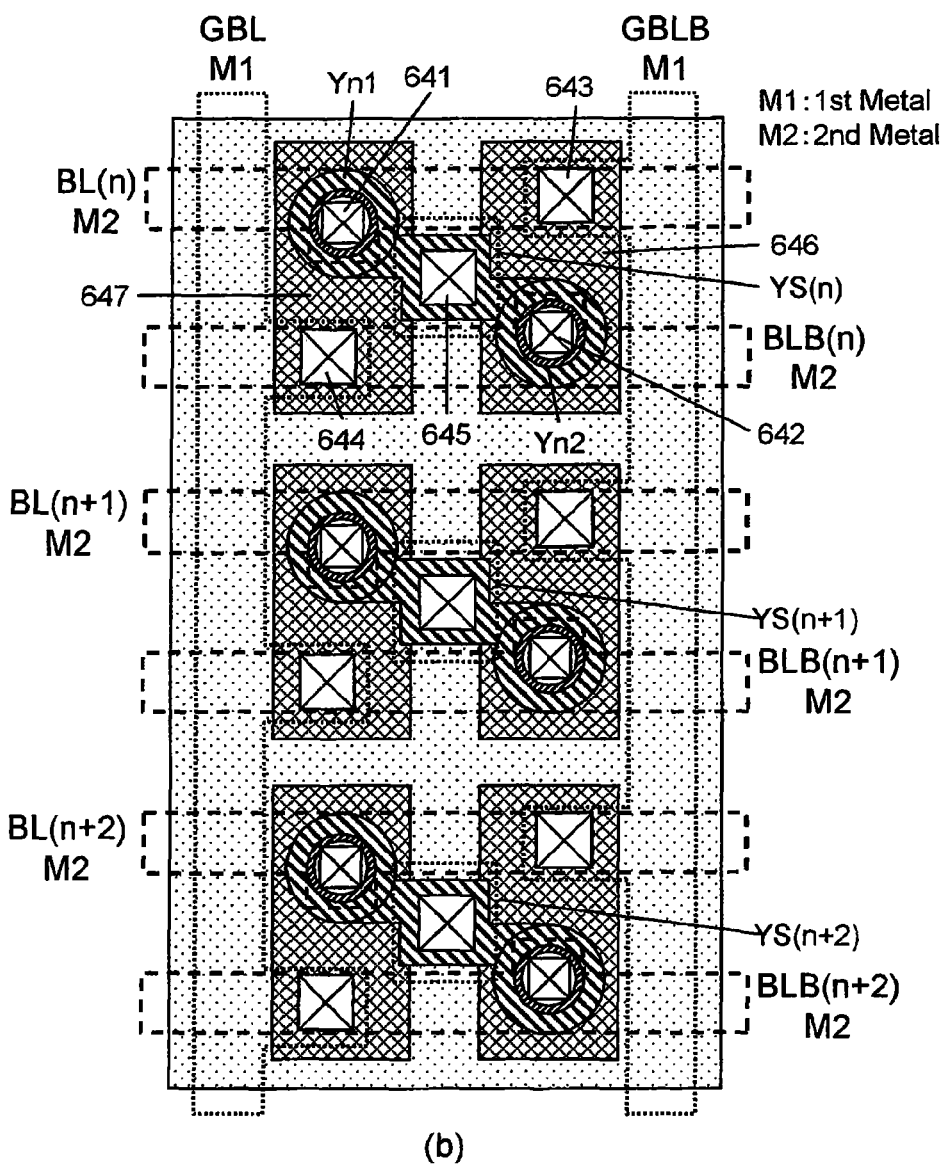
Figure 34:
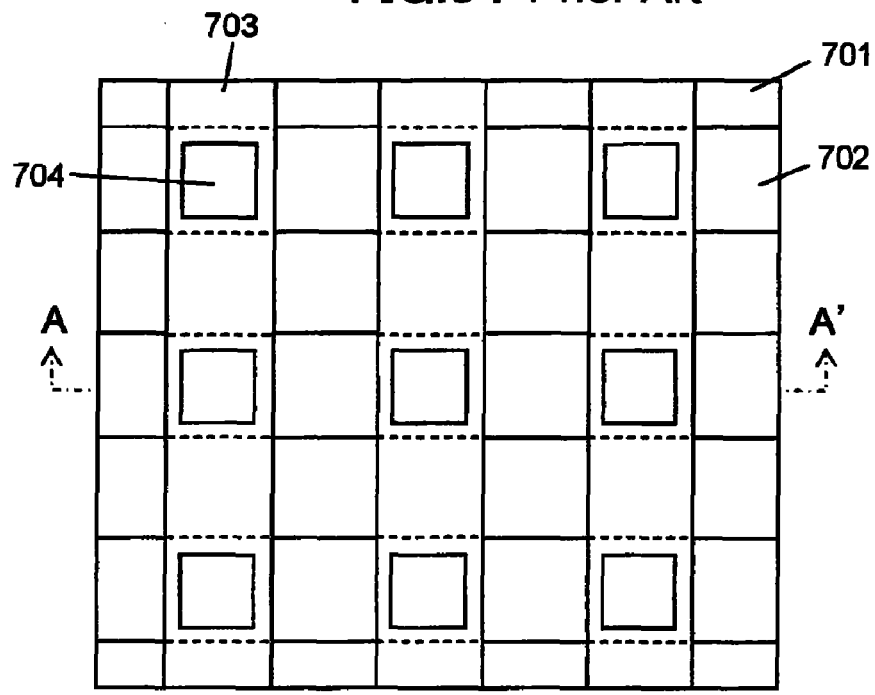
FIGS. 34(a) and 34(b) illustrate one example of a conventional SGT-DRAM.
Figure 34:
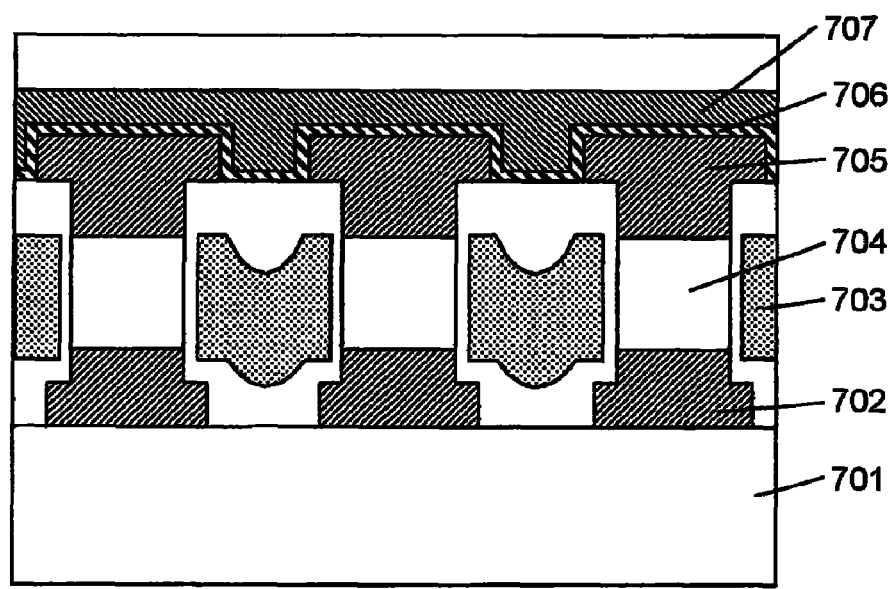
Figure 35:
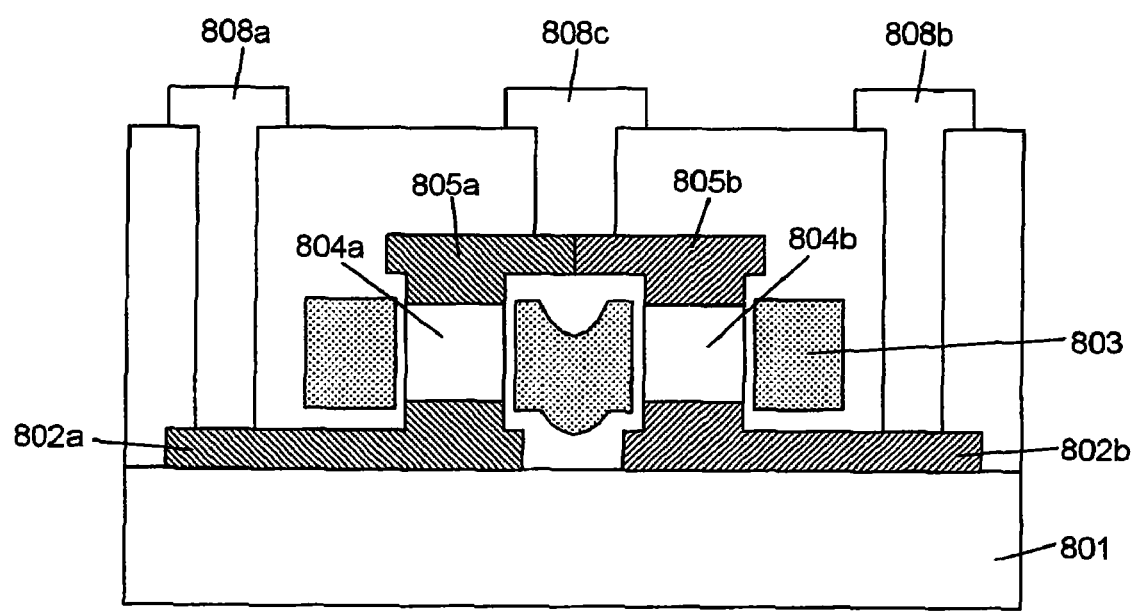
FIG. 35 illustrates another example of the conventional SGT-DRAM.
Figure 36:
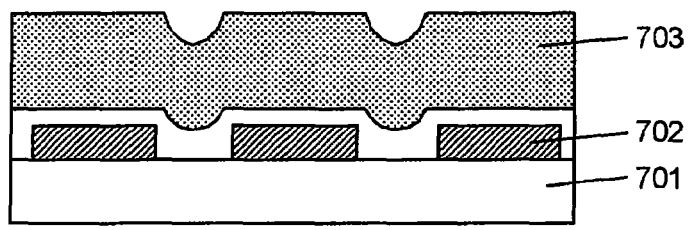
FIGS. 36(a) to 36(d) illustrate the conventional SGT-DRAM in FIG. 35.
Figure 36:
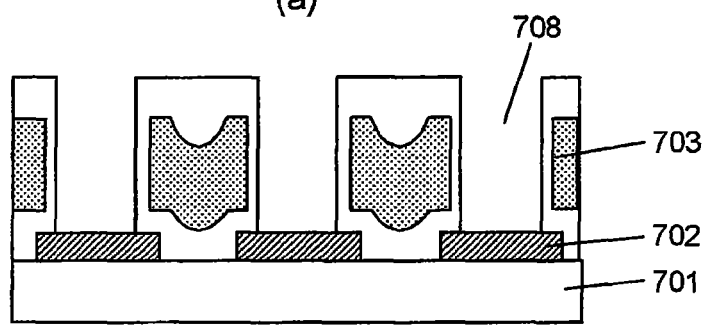
Figure 36:
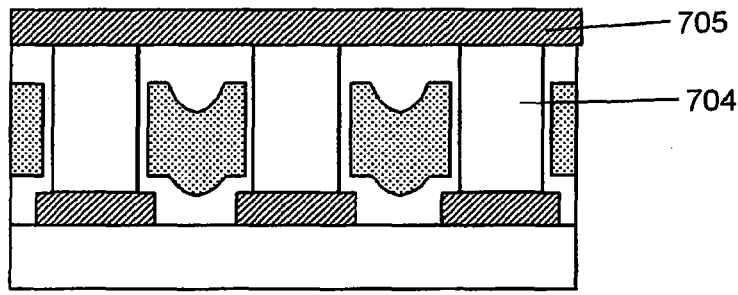
Figure 36:
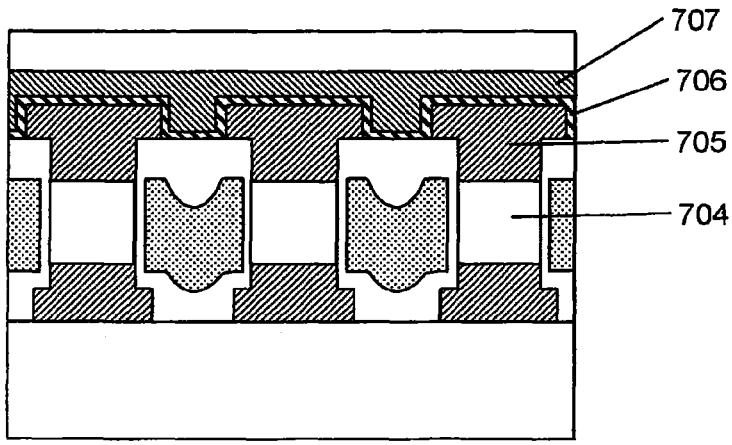

FIG. 33(a) illustrates an equivalent circuit of the row selection switch YS, and FIG. 33(b) illustrates a layout of the row selection switch YS. As shown in FIG. 33(a), when a signal of "1" is input into a row selection switch signal line YS(n), two NMOS transistors Yn1, Yn2 are turned on, so that signals on a bit line BL and a bit line BLB are read out, respectively, onto a global bit line GBL and a global bit line GBLB which are connected to an I/O circuit.

With reference to FIG. 33(b), a layout of the row selection switch will be described below. Each of a bit line BL(n) and a bit line BLB(n) in a row selection switch section is made up of a second metal layer line, and each of a global bit line GBL and a global bit line GBLB in the row selection switch section is made up of a first metal layer line. The bit line BL(n) is connected to a contact 641 formed on an upper diffusion layer of a pillar-shaped silicon layer forming an NMOS transistor Yn1. When the Yn1 is turned on, data is transferred onto the global bit line GBL through a contact 644 formed on an $N^+$ diffusion layer 647. The bit line BLB(n) is connected to a contact 642 formed on an upper diffusion layer of a pillar-shaped silicon layer forming an NMOS transistor Yn2. When the Yn2 is turned on, data is transferred onto the global bit line GBLB through a contact 643 formed on an $N^+$ diffusion layer 646. A contact 645 is formed on a gate line extending from respective gate electrodes of the row selection transistors Yn1, Yn2, and connected to the row selection switch signal line YS(n) formed as a first metal layer line and adapted to receive a row selection switch signal.

Although each of the transistors Yn1, Yn2 constituting row selection switch in the fourth embodiment is made up of an SGT comprising a single pillar-shaped silicon layer, the transistor may be made up of an SGT comprising a plurality of pillar-shaped silicon layers, depending on a performance requirement of the circuit.

What is claimed is:

1. A semiconductor storage device having a memory cell section and a peripheral circuit section each comprising at least one MOS transistors, the device comprising:
   a substrate;
   a dielectric film on the substrate; and
   a planar semiconductor layer on the dielectric film,
   wherein:
   the at least one MOS transistor in the memory cell section comprises a selection transistor,
   the at least one MOS transistor in the peripheral circuit section comprises a first MOS transistor and a second MOS transistor which are different in conductivity type from each other,
   the first MOS transistor includes a first lower drain or source region in the planar semiconductor layer, a first pillar-shaped semiconductor layer on the planar semiconductor layer, a first upper source or drain region in an upper portion of the first pillar-shaped semiconductor layer, and a first gate electrode, such that the first gate electrode surrounds a sidewall of the first pillar-shaped semiconductor layer and is separated therefrom by a first dielectric film,
   the second MOS transistor includes a second lower drain or source region in the planar semiconductor layer, a second pillar-shaped semiconductor layer on the planar semiconductor layer, a second upper source or drain region in an upper portion of the second pillar-shaped semiconductor layer, and a second gate electrode, such that the second gate electrode surrounds a sidewall of the second pillar-shaped semiconductor layer and is separated therefrom by a second dielectric film; and
   the selection transistor includes a third lower drain or source region in the planar semiconductor layer, a third pillar-shaped semiconductor layer on the planar semiconductor layer, a third upper source or drain region in an upper portion of the third pillar-shaped semiconductor layer, and a third gate electrode, such that the third gate electrode surrounds a sidewall of the third pillar-shaped semiconductor layer and is separated therefrom by a third dielectric film,
   and wherein the semiconductor storage device has a first silicide layer in the planar semiconductor layer and connecting at least a part of a surface of the first lower drain or source region of the first MOS transistor and at least a part of a surface of the second lower drain or source region of the second MOS transistor,
a voltage output line coupled to the first silicide layer by a pillar-shaped contact, and a second silicide layer on at least a part of a surface of the third lower drain or source region of the selection transistor.

2. The semiconductor storage device as defined in claim 1, wherein the first silicide layer resides in an area other than an area occupied by a contact for at least the first lower drain or source region and the second lower drain or source region.

3. The semiconductor storage device as defined in claim 1, further comprising a gate line extending from the third gate electrode, wherein a memory cell of the memory cell section comprises a cross-point type DRAM cell, wherein the third lower drain or source region comprises at least a bit line and the third gate electrode and the gate line extending from the third gate electrode comprises at least a word line.

4. The semiconductor storage device as defined in claim 3, further comprising:
a first contact on a top surface of the third upper source or drain region of the selection transistor, wherein a capacitor element resides on a top surface of the first contact;
a second contact on a top surface of the first or second upper source or drain region of the at least one MOS transistor in the peripheral circuit section; and
a third contact formed on a top surface of the second contact,
wherein the first contact has a top surface located at a same height position as that of the top surface of the second contact.

5. A semiconductor storage device having a memory cell array section and a peripheral circuit section each comprising one or more MOS transistors, the device comprising:
a substrate;
a dielectric film on the substrate; and
a planar semiconductor layer on the dielectric film,
wherein:
the peripheral circuit section comprises one or more peripheral circuit sections; and
the memory cell array section comprises a first memory cell array section and a second memory cell array section which are arranged on opposite sides of one of the peripheral circuit sections,
wherein:
the first and second memory cell array sections are configured such that a plurality of first bit lines from the first memory cell array section and a plurality of second bit lines from the second memory cell array section are alternately connected to the one peripheral circuit section, in such a manner that each of a plurality of pairs of the alternately connected first and second bit lines are connected to a respective one of a plurality of sense amplifiers provided in the one peripheral circuit section; and
the at least one MOS transistor in the peripheral circuit section comprises a MOS transistor constituting the sense amplifiers, the MOS transistor constituting the sense amplifier comprising a combination of a fourth PMOS transistor and a fourth NMOS transistor, and a combination of a fifth PMOS transistor and a fifth NMOS transistor,
wherein:
the fourth PMOS transistor includes a fourth P-type lower drain or source region in the planar semiconductor layer, a pillar-shaped semiconductor layer on the planar semiconductor layer, a fourth P-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film;
the fourth NMOS transistor includes a fourth N-type lower drain or source region in the planar semiconductor layer, a pillar-shaped semiconductor layer on the planar semiconductor layer, a fourth N-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film;
the fifth PMOS transistor includes a fifth P-type lower drain or source region in the planar semiconductor layer, a pillar-shaped semiconductor layer on the planar semiconductor layer, a fifth P-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film; and
the fifth NMOS transistor includes a fifth N-type lower drain or source region in the planar semiconductor layer, a pillar-shaped semiconductor layer on the planar semiconductor layer, a fifth N-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film, and wherein:
the semiconductor storage device has a fourth silicide layer thereon connecting at least a part of a surface of the fourth P-type lower drain or source region of the fourth PMOS transistor and at least a part of a surface of the fourth N-type lower drain or source region of the fourth NMOS transistor, a fifth silicide layer connecting at least a part of a surface of the fifth P-type lower drain or source region of the fifth PMOS transistor and at least a part of a surface of the fifth N-type lower drain or source region of the fifth NMOS transistor, the semiconductor storage device further comprising a fourth contact on the fourth silicide layer, a fifth contact on the fifth silicide layer, a sixth contact on a fourth gate line which connects respective gate electrodes of the fourth PMOS and NMOS transistors, and an seventh contact on a fifth gate line which connects respective gate electrodes of the fifth PMOS and NMOS transistors;
the combination of fourth PMOS and NMOS transistors and the combination of fifth PMOS and NMOS transistors are arranged in adjacent relation to each other and between the first bit line comprising a second metal layer line and the second bit lines each comprising the second metal layer line, the first bit line being connected to the fourth silicide layer through the fourth contact and connected to the fifth gate line through the seventh contact, the second bit line being connected to the fifth silicide layer through the fifth contact and connected to the fourth gate line through the sixth contact;
a power source potential line comprising a first metal layer line and perpendicular to the bit line is connected to an-eighth and ninth contacts which are on the fourth P-type upper source or drain region of the fourth PMOS transistor and the fifth P-type upper source or drain region of the fifth PMOS transistor respectively; and a ground potential line comprising the first metal layer line and perpendicular to the bit line is connected to an tenth and eleventh contacts on the fourth N-type upper source or drain region of the fourth NMOS transistor and the fifth N-type upper source or drain region of the fifth NMOS transistor respectively.

6. The semiconductor storage device as defined in claim 5, wherein the fourth silicide layer resides in an area other than an area occupied by a contact for at least the fourth P-type lower drain or source region and the fourth N-type lower drain or source region, or the fifth silicide layer resides in an area other than an area occupied by a contact for at least the fifth P-type lower drain or source region and the fifth N-type lower drain or source region.

7. A semiconductor storage device having a memory cell array section and a peripheral circuit section each comprising one or more MOS transistors, the device comprising:
   a substrate;
   a dielectric film on the substrate; and
   a planar semiconductor layer on the dielectric film,
   wherein:
   the peripheral circuit section comprises one or more peripheral circuit sections; and
   the memory cell array section comprises a third memory cell array section and a fourth memory cell array section which are arranged on opposite sides of one of the peripheral circuit sections,
   wherein:
   the third and fourth memory cell array sections are configured such that a plurality of third bit lines from the third memory cell array section and a plurality of fourth bit lines from the fourth memory cell array section are alternately connected to the one peripheral circuit section, in such a manner that each of a plurality of pairs of the alternately connected third and fourth bit lines are connected to a respective one of a plurality of row selection switch circuits provided in the one peripheral circuit section; and
   the at least one MOS transistor in the peripheral circuit section comprises a MOS transistor constituting the row selection switch circuits, the MOS transistor constituting the row selection switch circuit comprising a combination of a sixth NMOS transistor and a seventh NMOS transistor,
   the sixth NMOS transistor includes a sixth N-type lower drain or source region in the planar semiconductor layer, a pillar-shaped semiconductor layer on the planar semiconductor layer, a sixth N-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film,
   the seventh NMOS transistor includes a seventh N-type lower drain or source region in the planar semiconductor layer, a pillar-shaped semiconductor layer on the planar semiconductor layer, a seventh N-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film, and wherein:
   the semiconductor storage device has a sixth silicide layer on at least a part of a surface of the sixth N-type lower drain or source region of the sixth NMOS transistor, a seventh silicide layer on at least a part of a surface of the seventh N-type lower drain or source region of the seventh NMOS transistor and a sixth gate line which connects the gate electrode of the sixth NMOS transistor and the gate electrode of the seventh NMOS transistor, the semiconductor storage device further comprising a twelfth contact on the sixth silicide layer, a thirteenth contact on the seventh silicide layer, a fourteenth contact on the sixth N-type upper source or drain region and connected to the third bit line, a fifteenth contact on the seventh N-type upper source or drain region and connected to the fourth bit line and a sixteenth contact on the sixth gate line and connected to a row selection line.

8. A semiconductor storage device having a memory cell array section and a peripheral circuit section each comprising one or more MOS transistors, comprising:
   a substrate;
   a dielectric film on the substrate; and
   a planar semiconductor layer on the dielectric film,
   wherein:
   the peripheral circuit section comprises one or more peripheral circuit sections; and
   the memory cell array section comprises a fifth memory cell array section and a sixth memory cell array section which are arranged on opposite sides of one of the peripheral circuit sections,
   wherein:
   the fifth and sixth memory cell array sections are configured such that a plurality of fifth bit lines from the fifth memory cell array section and a plurality of sixth bit lines from the sixth memory cell array section are alternately connected to the one peripheral circuit section, in such a manner that each of a plurality of pairs of the alternately connected fifth and sixth bit lines are connected to a respective one of a plurality of pre-charge circuits provided in the one peripheral circuit section; and
   the at least one MOS transistor in the peripheral circuit section comprises a MOS transistor constituting the pre-charge circuits, the MOS transistor constituting the pre-charge circuit comprising a eighth NMOS transistor, a ninth NMOS transistor, and a tenth NMOS transistor,
   wherein:
   the eighth NMOS transistor includes an eighth N-type lower drain or source region in the planar semiconductor layer, a pillar-shaped semiconductor layer on the planar semiconductor layer, an eighth N-type upper source or drain region in an upper portion of the pillar-shaped semiconductor layer, and a gate electrode, such that the gate electrode surrounds a sidewall of the pillar-shaped semiconductor layer and is separated therefrom by a gate dielectric film,
   the ninth NMOS transistor includes a ninth N-type lower drain or source region in the planar semiconductor layer, a pillar-shaped semiconductor layer on the planar semiconductor layer, a ninth N-type upper source or drain region in an upper portion of the pillar-shaped semiconductor layer, and a gate electrode such that the gate electrode surrounds a sidewall of the pillar-shaped semiconductor layer through a gate dielectric film; and
   the tenth NMOS transistor includes a tenth N-type lower drain or source region in the planar semiconductor layer, a pillar-shaped semiconductor layer on the planar semiconductor layer, a tenth N-type upper source or drain region in an upper portion of the pillar-shaped semiconductor layer, and a gate electrode such that the gate electrode surrounds a sidewall of the pillar-shaped semiconductor layer through a gate dielectric film, and wherein:

the semiconductor storage device has an eighth silicide layer on at least a part of a surface of the eighth N-type lower drain or source region of the eighth NMOS transistor, a ninth silicide layer on at least a part of a surface of the ninth N-type lower drain or source region of the ninth NMOS transistor and an eighth gate line which connects the respective gate electrodes of the eighth NMOS transistor, the ninth NMOS transistor and the tenth NMOS transistor, the semiconductor storage device further comprising a seventeenth contact on the eighth silicide layer and connected to the fifth bit line, a eighteenth contact on the ninth silicide layer and connected to the sixth bit line, and a nineteenth and twentieth contact on the eighth and ninth N-type upper source or drain region respectively both of which are connected to a ½ power supply voltage line, and a twenty-first contact on the eighth gate line and connected to the pre-charge signal line; and the eighth N-type lower drain or source region and the tenth N-type lower drain or source region are connected through the eighth silicide layer, or the ninth N-type lower drain or source region and the tenth N-type lower drain or source region are connected through the ninth silicide layer, or both.

9. A method of producing a semiconductor storage device which has a memory cell section and a peripheral circuit section each formed using one or more MOS transistors, comprising the steps of:

forming a planar semiconductor layer on a dielectric film on a substrate, and a plurality of pillar-shaped semiconductor layers on the planar semiconductor layer;

isolating the planar semiconductor layer as an element;

forming a drain or source region in the planar semiconductor layer;

thereafter forming a first dielectric film on at least a part of a surface of the resulting product;

forming a conductive film on the first dielectric film;

etching back the conductive film;

selectively removing by etching the conductive film including a portion thereof corresponding to a portion in which a silicide layer is formed to form a gate electrode around each of the pillar-shaped semiconductor layers and a gate line extending from the gate electrode;

forming a source or drain region in an upper portion of each of the plurality of pillar-shaped semiconductor layers to have a same conductivity type as that of the drain or source region;

forming the silicide layer for connecting at least a part of a surface of the drain or source region of each of first MOS transistors and at least a part of a surface of the drain or source region of each of second MOS transistors, wherein each of the first and second MOS transistors is one of a plurality of MOS transistors corresponding to respective ones of the plurality of pillar-shaped semiconductor layers, the first and second MOS transistors are included in the peripheral circuit, and the second MOS transistor has a different conductive type from that of the first MOS transistor;

forming a contact on a top surface of the source or drain region of each of the MOS transistors corresponding to the respective ones of the plurality of pillar-shaped semiconductor layers;

forming a capacitor element on a top surface of the contact formed on the top surface of the source or drain region of each of third ones of the MOS transistors corresponding to the respective ones of the plurality of pillar-shaped semiconductor layers, wherein the third MOS transistors are included in the memory cell section; and forming an additional contact on a top surface of the contact formed on the top surface of the source or drain region of each of the first and second MOS transistors.

10. The method as defined in claim 9, wherein forming the silicide layer further comprises forming the silicide layer on a surface of the source or drain region of each of the first and second MOS transistors.

11. A method of producing a semiconductor storage device which has a memory cell section and a peripheral circuit section each formed using one or more MOS transistors, comprising the steps of:

forming a planar semiconductor layer on a dielectric film on a substrate, and a plurality of pillar-shaped semiconductor layers on the planar semiconductor layer;

isolating the planar semiconductor layer as an element;

forming a drain or source region in the planar semiconductor layer;

thereafter forming a first dielectric film on at least a part of a surface of the resulting product; forming a conductive film on the first dielectric film;

etching back the conductive film;

selectively removing by etching the conductive film including a portion thereof corresponding to a portion in which the a silicide layer is formed to form a gate electrode formed around each of the pillar-shaped semiconductor layers and a gate line extending from the gate electrode;

forming a source or drain region in an upper portion of each of the plurality of pillar-shaped semiconductor layers to have a same conductivity type as that of the drain or source region;

thereafter forming a protective film on a surface of the resulting product;

removing by etching the protective film only in the peripheral circuit section;

forming the silicide layer for connecting at least a part of a surface of the drain or source region of each of first MOS transistors and at least a part of a surface of the drain or source region of each of second MOS transistors, wherein each of the first and second MOS transistors is one of a plurality of MOS transistors corresponding to respective ones of the plurality of pillar-shaped semiconductor layers, the first and second MOS transistors are included in the peripheral circuit, and the second MOS transistor has a different conductive type from that of the first MOS transistor;

forming a contact on a top surface of the source or drain region of each of the MOS transistors corresponding to the respective ones of the plurality of pillar-shaped semiconductor layers;

forming a capacitor element on a top surface of the contact formed on the top surface of the source or drain region of each of third ones of the MOS transistors corresponding to the respective ones of the plurality of pillar-shaped semiconductor layers, wherein the third MOS transistors are included in the memory cell section; and forming an additional contact on a top surface of the contact formed on the top surface of the source or drain region of each of the first and second MOS transistors.

12. The method as defined in claim 11, wherein forming the silicide layer further comprises forming a silicide layer on a surface of the source or drain region of each of the first and second MOS transistors.

* * * * *